(12) United States Patent
Kim et al.

(10) Patent No.: US 12,438,064 B2
(45) Date of Patent: Oct. 7, 2025

(54) SEMICONDUCTOR PACKAGE WITH BONDING INTERFACE

(71) Applicant: Samsung Electronics Co., Ltd., Suwon-si (KR)

(72) Inventors: Minki Kim, Suwon-si (KR); Seungduk Baek, Hwaseong-si (KR); Soojeoung Park, Hwaseong-si (KR); Hyuekjae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 540 days.

(21) Appl. No.: 17/854,659

(22) Filed: Jun. 30, 2022

(65) Prior Publication Data

US 2023/0113465 A1    Apr. 13, 2023

(30) Foreign Application Priority Data

Oct. 12, 2021    (KR) ........................ 10-2021-0135183

(51) Int. Cl.
*H01L 23/48* (2006.01)
*H01L 23/00* (2006.01)
*H01L 25/065* (2023.01)

(52) U.S. Cl.
CPC ............ *H01L 23/481* (2013.01); *H01L 24/05* (2013.01); *H01L 24/08* (2013.01); *H01L 24/80* (2013.01);

(Continued)

(58) Field of Classification Search
CPC ....... H01L 23/481; H01L 24/05; H01L 24/08; H01L 2224/05009; H01L 2224/05082;
(Continued)

(56) References Cited

U.S. PATENT DOCUMENTS 7,385,283 B2    6/2008  Wu et al.
9,142,517 B2 *  9/2015  Liu ......................... H01L 24/08
(Continued)

FOREIGN PATENT DOCUMENTS

KR      20140042631 A     4/2014
KR      10-2021-0024869 A  3/2021

*Primary Examiner* — Mamadou L Diallo
(74) *Attorney, Agent, or Firm* — Wolf, Greenfield & Sacks, P.C.

(57) ABSTRACT

A semiconductor package includes a first semiconductor chip including a first semiconductor layer, a first through-electrode that penetrates through the first semiconductor layer, a first bonding pad connected to the first through-electrode, and a first insulating bonding layer, and a second semiconductor chip on the first semiconductor chip and including a second semiconductor layer, a second bonding pad bonded to the first bonding pad, and a second insulating bonding layer bonded to the first insulating bonding layer, wherein the first insulating bonding layer includes a first insulating material, the second insulating bonding layer includes a first insulating layer that forms a bonding interface with the first insulating bonding layer and a second insulating layer on the first insulating layer, the first insulating layer includes a second insulating material, different from the first insulating material, and the second insulating layer includes a third insulating material, different from the second insulating material.

20 Claims, 25 Drawing Sheets

(52) U.S. Cl.
CPC ...... *H01L 25/0652* (2013.01); *H01L 25/0657* (2013.01); *H01L 24/16* (2013.01); *H01L 2224/05007* (2013.01); *H01L 2224/05009* (2013.01); *H01L 2224/05017* (2013.01); *H01L 2224/05078* (2013.01); *H01L 2224/05082* (2013.01); *H01L 2224/05083* (2013.01); *H01L 2224/05084* (2013.01); *H01L 2224/05087* (2013.01); *H01L 2224/05187* (2013.01); *H01L 2224/05547* (2013.01); *H01L 2224/05557* (2013.01); *H01L 2224/05578* (2013.01); *H01L 2224/05647* (2013.01); *H01L 2224/05687* (2013.01); *H01L 2224/0801* (2013.01); *H01L 2224/08059* (2013.01); *H01L 2224/08121* (2013.01); *H01L 2224/08145* (2013.01); *H01L 2224/08146* (2013.01); *H01L 2224/16227* (2013.01); *H01L 2224/16238* (2013.01); *H01L 2224/80097* (2013.01); *H01L 2224/80895* (2013.01); *H01L 2224/80896* (2013.01); *H01L 2224/80948* (2013.01); *H01L 2225/06524* (2013.01); *H01L 2225/06527* (2013.01); *H01L 2225/06544* (2013.01); *H01L 2924/1431* (2013.01); *H01L 2924/1434* (2013.01); *H01L 2924/15331* (2013.01)

(58) Field of Classification Search
CPC . H01L 2224/05083; H01L 2224/05084; H01L 24/80; H01L 25/0652; H01L 25/0657; H01L 2224/08145
See application file for complete search history.

(56) References Cited

U.S. PATENT DOCUMENTS

| | | |
|---|---|---|
| 10,790,248 B2 | 9/2020 | Chen et al. |
| 11,322,466 B2* | 5/2022 | Okina .................. H01L 24/06 |
| 2014/0091438 A1 | 4/2014 | Liu et al. |
| 2014/0117546 A1* | 5/2014 | Liu .................. H01L 25/0657 |
| | | 438/669 |
| 2014/0284744 A1* | 9/2014 | Fujii ................ H01L 21/76823 |
| | | 438/57 |
| 2016/0064357 A1* | 3/2016 | Choe .................... H01L 24/06 |
| | | 438/109 |
| 2017/0358553 A1* | 12/2017 | Kim .................... H01L 24/92 |
| 2020/0006285 A1 | 1/2020 | Wang et al. |
| 2020/0135699 A1* | 4/2020 | Hwang .................. H01L 25/18 |
| 2020/0303361 A1* | 9/2020 | Shih .................. H01L 23/5283 |
| 2020/0365593 A1* | 11/2020 | Chen .................... H01L 25/50 |
| 2020/0402942 A1 | 12/2020 | Chen et al. |
| 2020/0402960 A1 | 12/2020 | Chen et al. |
| 2021/0066224 A1 | 3/2021 | Jang et al. |
| 2021/0098381 A1 | 4/2021 | Yu et al. |
| 2023/0021152 A1 | 1/2023 | Hwang et al. |

* cited by examiner

SEMICONDUCTOR PACKAGE WITH BONDING INTERFACE

CROSS-REFERENCE TO RELATED APPLICATION(S)

This application claims benefit of priority to Korean Patent Application No. 10-2021-0135183 filed on Oct. 12, 2021 in the Korean Intellectual Property Office, the disclosure of which is incorporated herein by reference in its entirety.

BACKGROUND

The present inventive concept relates to a semiconductor package and a method of manufacturing the same.

According to the trend for miniaturization and high performance of semiconductor packages, the development of a system-in-package (SiP) technology of embedding a plurality of semiconductor chips performing different functions in a single package has taken place. In order to form fine wiring connecting semiconductor chips in a single package, a technique of forming a through silicon via (TSV) and bonding the semiconductor chips to each other through bonding pads has been used.

SUMMARY

An aspect of the present inventive concept is to provide a semiconductor package having improved reliability and a method for manufacturing the same.

According to an aspect of the present inventive concept, a semiconductor package includes: a first semiconductor chip including a first semiconductor layer, a first through-electrode that penetrates through the first semiconductor layer in a vertical direction, a first bonding pad connected to the first through-electrode, and a first insulating bonding layer on a side surface of the first bonding pad; and a second semiconductor chip disposed on the first semiconductor chip and including a second semiconductor layer, a second bonding pad below the second semiconductor layer and bonded to the first bonding pad, and a second insulating bonding layer on a side surface of the second bonding pad and bonded to the first insulating bonding layer, wherein the first insulating bonding layer includes a first insulating material, the second insulating bonding layer includes a first insulating layer that forms a bonding interface with the first insulating bonding layer and a second insulating layer on the first insulating layer, the first insulating layer includes a second insulating material, different from the first insulating material, and the second insulating layer includes a third insulating material, different from the second insulating material.

According to an aspect of the present inventive concept, a semiconductor package includes: a first structure and a second structure on the first structure, wherein the first structure includes: a first semiconductor layer including a first front surface and an opposite first rear surface; a first device layer on the first front surface of the first semiconductor layer and including a first interconnection layer; a first through-electrode penetrating the first semiconductor layer and connected to the first interconnection layer of the first device layer; and a first bonding structure including a first bonding pad on the first rear surface of the first semiconductor layer and connected to the first through-electrode and a first insulating bonding layer on a side surface of the first bonding pad, and the second structure includes: a second semiconductor layer having a second front surface and an opposite second rear surface; a second device layer on the second front surface of the second semiconductor layer and including a second interconnection layer; and a second bonding structure including a second bonding pad below the second device layer and bonded to and in direct contact with the first bonding pad and a second insulating bonding layer in direct contact with and bonded to the first insulating bonding layer, wherein the first bonding pad and the second bonding pad bonded to each other to form a portion of a bonding interface form an asymmetrical structure in which at least one of widths and thicknesses thereof are different, and the first insulating bonding layer and the second insulating bonding layer bonded to each other to form a portion of the bonding interface include different materials.

According to an aspect of the present inventive concept, a semiconductor package includes: a first structure and a second structure on the first structure, wherein the second structure includes a plurality of semiconductor chips stacked on the first structure, and each of the plurality of semiconductor chips of the second structure includes: a semiconductor layer; a through-electrode that penetrates through the semiconductor layer in a vertical direction; a device layer connected to a first end of the through-electrode; a rear bonding structure connected to a second, opposite end of the through-electrode; and a front bonding structure below the device layer, wherein, among the plurality of semiconductor chips of the second structure, the rear bonding structure of a lower semiconductor chip is directly bonded to and stacked on the front bonding structure of an upper semiconductor chip, and an outermost insulating layer of the front bonding structure and an outermost insulating layer of the rear bonding structure include different materials.

According to an aspect of the present inventive concept, a method of manufacturing a semiconductor package includes: forming a first structure including a first semiconductor layer, a first through-electrode that penetrates through the first semiconductor layer in a vertical direction, a first bonding pad connected to the first through-electrode, and a first insulating bonding layer on a side surface of the first bonding pad; forming a second structure including a second semiconductor layer, a second bonding pad below the second semiconductor layer, and a second insulating bonding layer on a side surface of the second bonding pad; and bonding the first structure to the second structure such that the first bonding pad is in direct contact with the second bonding pad and the first insulating bonding layer is in direct contact with the second insulating bonding layer, wherein the first insulating bonding layer and the second insulating bonding layer, bonded to each other to form a portion of a bonding interface, are formed of different materials.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
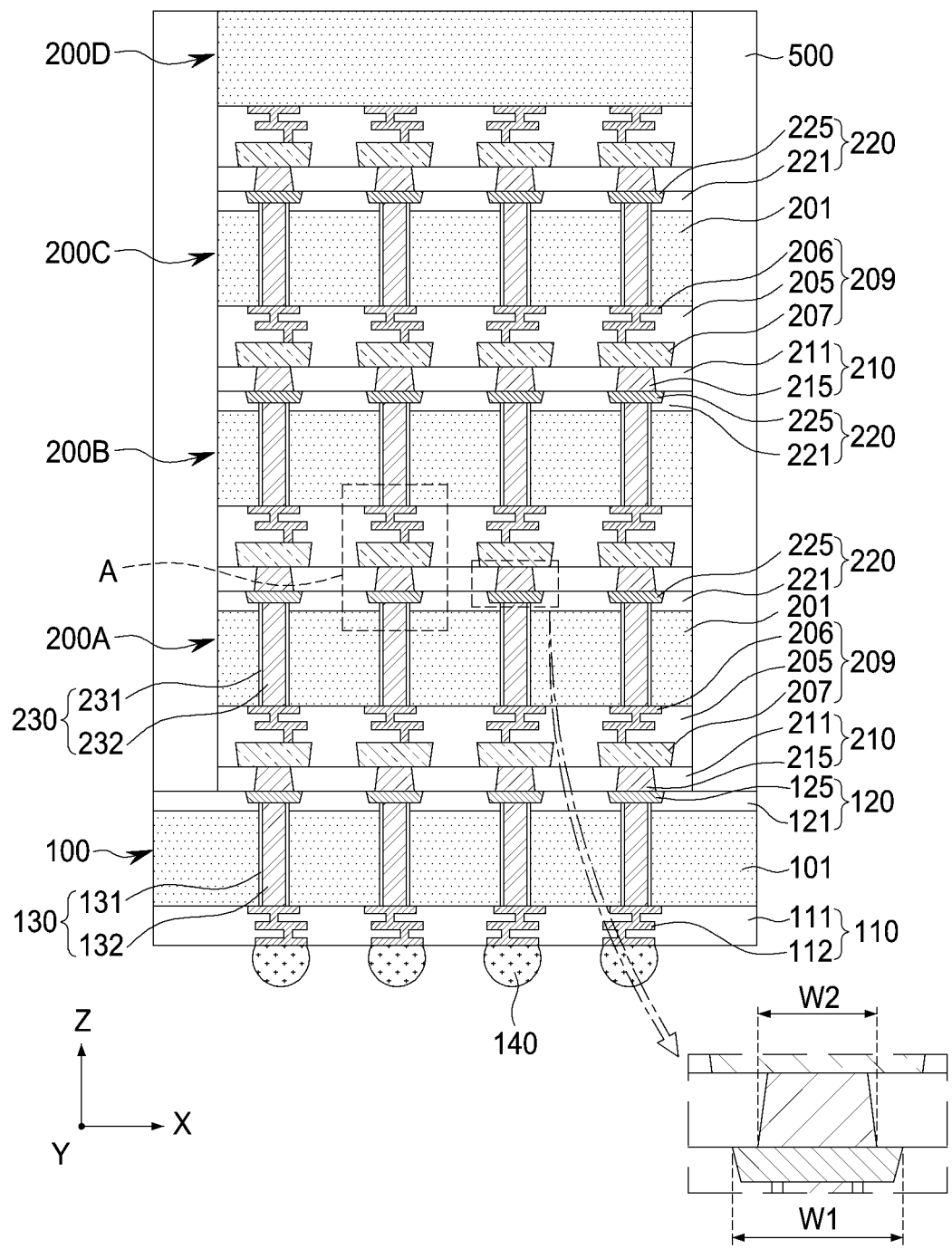
FIG. 1 is a cross-sectional view illustrating a semiconductor package according to an embodiment of the present inventive concept.

FIG. 1 is a cross-sectional view illustrating a semiconductor package according to an embodiment of the present inventive concept.

Figure 2:
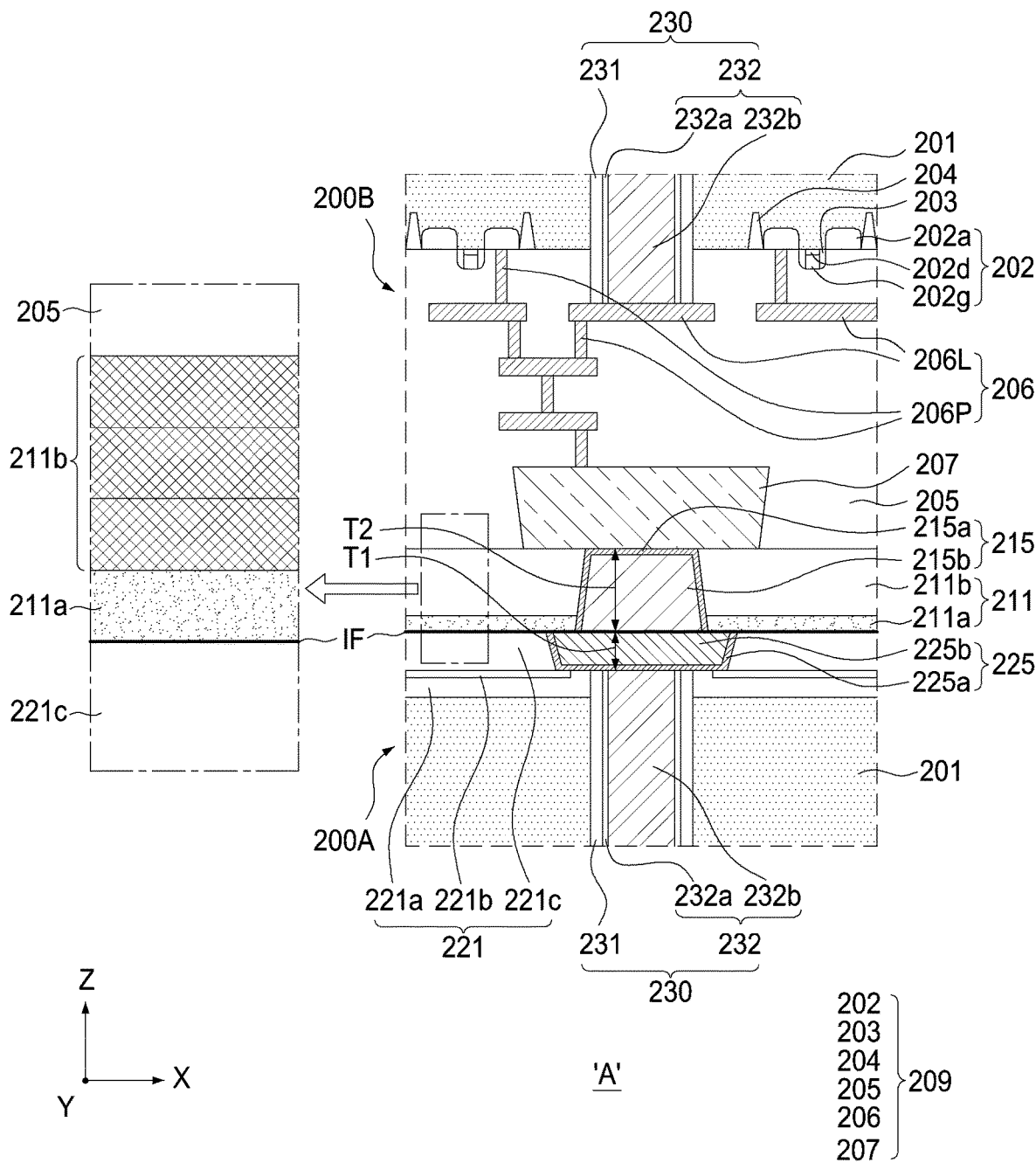
FIGS. 2 to 8 are partially enlarged views illustrating a semiconductor package according to an embodiment of the present inventive concept.

FIG. 2 is a partially enlarged view illustrating a semiconductor package according to an embodiment of the present inventive concept. FIG. 2 is an enlarged view of region 'A' of FIG. 1.

Referring to FIGS. 1 and 2, a semiconductor package 1000 according to an example embodiment may include a first semiconductor chip 100 and second semiconductor chips 200A, 200B, 200C, and 200D. The second semiconductor chips 200A, 200B, 200C, and 200D may be stacked in a vertical direction (the Z-axis direction). According to embodiments, the number of the second semiconductor chips 200A, 200B, 200C, and 200D may be greater or less than those shown in the drawings. For example, the semiconductor packages according to the present inventive concept may include three or less or five or more second semiconductor chips.

The first semiconductor chip 100 and the second semiconductor chips 200A, 200B, 200C, and 200D stacked in the vertical direction (the Z-axis direction) may be electrically connected through first and second through-electrodes 130 and 230. The first semiconductor chip 100 and the second semiconductor chips 200A, 200B, 200C, and 200D may have a structure (e.g., hybrid bonding, direct bonding, etc.) in which elements exposed to the upper and lower surfaces of each of the semiconductor chips are directly bonded without a separate connection member (e.g., a metal pillar, a solder bump, etc.). Dielectric-to-dielectric bonding and copper-to-copper bonding may be formed at an interface between the first semiconductor chip 100 and the lowermost second semiconductor chip 200A among the second semiconductor chips 200A, 200B, 200C, and 200D, and dielectric-to-dielectric bonding and copper-to-copper bonding may also be formed at interfaces between the second semiconductor chips 200A, 200B, 200C, and 200D.

As shown in FIG. 2, a rear insulating bonding layer 221 and a rear bonding pad 225 of the lower second semiconductor chip 200A may be bonded with a front insulating bonding layer 211 and a front bonding pad 215 of the upper second semiconductor chip 200B. According to an embodiment of the present inventive concept, the rear insulating bonding layer 221 and the front insulating bonding layer 211 to be bonded to each other may be formed of different materials to improve bonding strength of the dielectric-to-dielectric bonding between the insulating bonding layers forming a bonding interface IF. The rear insulating bonding layer 221 and the front insulating bonding layer 211 may be formed of different materials among silicon oxide, silicon nitride, silicon carbon nitride, and silicon oxycarbonitride. According to an embodiment of the present inventive concept, it was experimentally confirmed that, when a bonding structure was formed by an annealing process at a low temperature (e.g., a temperature of about 200° C. or less), dielectric-to-dielectric bonding strength was higher in the case of bonding between heterogeneous insulating bonding layers than in the case of bonding between homogenous insulating bonding layers (e.g., bonding between silicon oxides or bonding between silicon carbon nitrides).

Meanwhile, the rear insulating bonding layer 221 and the front insulating bonding layer 211 may be formed under different process conditions, for example, different deposition temperatures. For example, the rear insulating bonding layer 221 may be formed at a temperature relatively lower than a formation temperature of the front insulating bonding layer 211. The rear insulating bonding layer 221 may be formed of silicon oxide in a relatively low temperature deposition process (e.g., in a temperature range of about 150° C. to about 200° C.), and the front insulating bonding layer 211 may be formed at a relatively high temperature deposition process (e.g., a temperature range of about 350° C. to about 400° C.). By forming the insulating bonding layer in a relatively low temperature deposition process condition, thermal history of the integrated circuit may be reduced to improve the reliability of the semiconductor package, and a material for low-temperature process may be used, which will broaden the selection of materials. Meanwhile, the rear insulating bonding layer 221 may have a porous structure with more pores inside than the front insulating bonding layer 211, and in this case, a bonding surface of the rear insulating bonding layer 221 before bonding may have a surface roughness, thereby improving bonding strength between the insulating bonding layers.

According to an embodiment of the present inventive concept, the rear insulating bonding layer 221 may include a plurality of rear insulating layers 221a, 221b, and 221c, and the front insulating bonding layer 211 may include a plurality of front insulating layers 211a and 211b. Among the plurality of rear insulating layers 221a, 221b, and 221c, the first rear insulating layer 221a may cover or surround side surfaces of a second semiconductor layer 201 and a second through-structure 230, the second rear insulating layer 221b may be disposed on the first rear insulating layer 221a and may be spaced apart from the side surface of the second through-structure 230, and the third rear insulating layer 221c may have an opening so that the rear bonding pad 225 may be connected to a second through-electrode 232. The plurality of front insulating layers 211a and 211b may include a first front insulating layer 211a and a second front insulating layer 211b on the first front insulating layer 211a, and the second front insulating layer 211b may include one or a plurality of insulating layers. As shown in the left enlarged view of FIG. 2, the second front insulating layer 211b may include a plurality of insulating layers formed of the same material but whose boundaries are separated according to process conditions. The third rear insulating layer 221c as the outermost or uppermost insulating layer among the plurality of rear insulating layers 221a, 221b, and 221c and the first front insulating layer 211a as the outermost or lowermost insulating layer among the plurality of front insulating layers 211a and 211b may be in direct contact to form at least a portion of the bonding interface IF.

The first front insulating layer 211a may be formed of, for example, silicon carbon nitride, and may be oxidized to silicon oxycarbonitride while bonding to the third rear insulating layer 221c. Accordingly, below the bonding interface IF, an insulating layer including silicon oxide as a first insulating material may be disposed, and above the bonding interface IF, a first insulating layer including silicon oxycarbonitride as a second insulating material and a second insulating layer including silicon carbon nitride as a third insulating material may be disposed.

In FIG. 2, a peripheral region of the bonding interface between the second semiconductor chips 200A, 200B, 200C, and 200D bonded up and down is enlarged, but the present inventive concept may also be equally applied to a peripheral region of the bonding interface in which the first semiconductor chip 100 of FIG. 1 and the lowermost second semiconductor chip 200A among the second semiconductor chips 200A, 200B, 200C, and 200D are bonded to each other. For example, the rear insulating layer 121 of a first rear structure 120 of the first semiconductor chip 100 may be formed of an insulating material different from an insulating material of the front insulating bonding layer 211 of the lowermost second semiconductor chip 200A.

Hereinafter, components of the semiconductor package 1000 according to an example embodiment will be described in detail.

The first semiconductor chip 100 may include a first semiconductor layer 101, a first device layer 110, a first rear structure 120, and a first through-structure 130. The first semiconductor chip 100 may be a buffer chip or a control chip including a plurality of logic devices and/or memory devices in the first device layer 110. The first semiconductor chip 100 may transmit signals from the second semiconductor chips 200A, 200B, 200C, and 200D stacked thereon externally, and may also transmit signals and power from the outside to the second semiconductor chips 200A, 200B, 200C, and 200D. The first device layer 110 may include first integrated circuits disposed on the front surface of the first semiconductor layer 101 facing the first device layer 110. The first integrated circuits may include circuits for transmitting an address command or a control command so that the second semiconductor chips 200A, 200B, 200C, and 200D may store or output data, for example, input/output (I/O) circuit and the like. For example, the integrated circuits may perform both a logic function and a memory function through logic elements and memory elements. However, according to an embodiment, the first integrated circuits may include only logic elements to perform only a logic function.

The first semiconductor layer 101 may include, for example, a semiconductor element such as silicon (Si) or germanium (Ge), silicon carbide (SiC), gallium arsenide (GaAs), indium arsenide (InAs), or indium phosphide (InP). The first semiconductor layer 101 may have a silicon on insulator (SOI) structure. The first semiconductor layer 101 may include an active region, for example, a well doped with an impurity or a structure doped with an impurity. The first semiconductor layer 101 may include various device isolation structures such as a shallow trench isolation (STI) structure. The first semiconductor layer 101 may have an active surface having an active region and an inactive surface positioned opposite thereto.

The first device layer 110 may be disposed on a lower surface (e.g., the active surface) of the first semiconductor layer 101 and may include various types of individual devices. The individual devices may be disposed in the active region of the first semiconductor layer 101 and may include various active and/or passive devices. The first device layer 110 may include a first interlayer insulating layer 111 covering the individual devices and a first interconnection layer 112 connecting the individual devices to each other, connecting the individual devices to the active region of the first semiconductor layer 101, or connecting the individual devices to connection bumps 140. The first interlayer insulating layer 111 may include silicon oxide, silicon nitride, silicon oxynitride, or tetraethyl orthosilicate (TEOS). The first interlayer insulating layer 111 may include a plurality of layers. The first interconnection layer 112 may include, for example, metallic materials including copper (Cu), aluminum (Al), silver (Ag), tin (Sn), gold (Au), nickel (Ni), lead (Pb), or titanium (Ti), or alloys thereof. The first interconnection layer 112 may have a multilayer structure including an interconnection pattern and a via. An insulating protective film electrically separating the first interconnection layer 112 from the first semiconductor layer 101 may be disposed between the first device layer 110 and the first semiconductor layer 101.

The connection bumps 140 may be disposed under the first device layer 110. The connection bumps 140 may include bumps for communication with an external device (e.g., '800' in FIG. 9) in addition to bumps for communication with the second semiconductor chips 200A, 200B, 200C, and 200D. The connection bumps 140 may include a low-melting-point metal, for example, or an alloy including tin (Sn) (e.g., Sn—Ag—Cu). The connection bumps 140 may include, for example, solder balls. Each of the connection bumps 140 may have a land, ball, or pin shape. Each of the connection bumps 140 may be formed as a multilayer or a single layer.

The first rear structure 120 may be disposed on an upper surface (e.g., an inactive surface) of the first semiconductor layer 101. The first rear structure 120 may include a first bonding pad 125 connected to a first through-electrode 132 and a first insulating bonding layer 121 on a side surface of the first bonding pad 125. The first bonding pad 125 and the first insulating bonding layer 121 may be directly bonded to the lowermost second semiconductor chip 200A among the second semiconductor chips 200A, 200B, 200C, and 200D. The first insulating bonding layer 121 may be formed of any one of silicon oxide, silicon nitride, silicon carbon nitride, and silicon oxycarbonitride. The first insulating bonding layer 121 may include an insulating material different from that of the second front insulating layer 211 of the second semiconductor chip 200.

The first through-structure 130 may penetrate through the first semiconductor layer 101 in a vertical direction (the Z-axis direction) and provide an electrical path connecting the first interconnection layer 112 and the first bonding pad 125 to each other. The first through-structure 130 may include a first spacer 131 and a first through-electrode 132. The first through-electrode 132 may include a conductive plug and a barrier layer surrounding the conductive plug, which is similar to the structure of the second through-electrode 232 of FIG. 2, and thus the following description of the second through-electrode 232 will be cited.

The second semiconductor chips 200A, 200B, 200C, and 200D may be disposed on the first semiconductor chip 100 and include a second semiconductor layer 201, a second device layer 209, a second front structure 210, a second rear structure 220, and a second through-structure 230, respectively. Since the second semiconductor chips 200A, 200B, 200C, and 200D may have substantially the same or similar structures, hereinafter, the lowermost second semiconductor chip 200A will mainly be described, and reference numerals and a redundant description for the same components may be omitted in the interest of brevity. However, unlike the other second semiconductor chips 200A, 200B, and 200C, the second semiconductor chip 200D disposed on the uppermost level may not include the second through-structure 230. In addition, the second semiconductor layer 201, the second device layer 209, and the second through-structure 230 have characteristics the same as or similar to those of the first semiconductor layer 101 of the first semiconductor chip 100, the first device layer 110, and the first through-structure 130, and thus a repeated description thereof may be omitted in the interest of brevity.

The second semiconductor layer 201 may include a material the same as or similar to a material of first semiconductor layer 101. The second semiconductor layer 201 may have a smaller size (e.g., width) than the first semiconductor layer 101, but is not limited thereto.

The second device layer 209 may include a second interlayer insulating layer 205, a second interconnection layer 206, an interconnection pad 207, transistors 202, and device isolation layers 204. The interconnection pad 207 may be connected to the plug or via 206P of the second interconnection layer 206, and may have a thickness greater than that of the interconnection pattern 206L of the second interconnection layer 206. The second interconnection layer 206 and the interconnection pad 207 may include a metallic material including copper (Cu), aluminum (Al), silver (Ag), tin (Sn), gold (Au), nickel (Ni), lead (Pb), and titanium. (Ti), or alloys thereof. The interconnection pad 207 may be formed of a metallic material different from that of the second interconnection layer 206.

The second device layer 209 may include second integrated circuits including transistors 202 disposed on the front surface (e.g., active surface) of the second semiconductor layer 201 facing the second device layer 209. The second integrated circuits may include memory devices storing or outputting data based on an address command and a control command received from the first semiconductor chip 100. For example, the memory devices may include volatile memory devices such as DRAM and SRAM or non-volatile memory devices such as PRAM, MRAM, FeRAM, or RRAM.

In this case, the semiconductor packages according to the embodiments of the present inventive concept may be used in a high bandwidth memory (HBM) product, an electro data processing (EDP) product, or the like.

Each of the transistors 202 may include a gate electrode 202g, a gate dielectric layer 202d, and an impurity region 202a, as shown in FIG. 2. The impurity region 202a may be, for example, a well doped with an impurity or a structure doped with an impurity. The impurity region 202a may function, for example, as a source region or a drain region of the transistor 202. The gate dielectric layer 202d may be disposed between the gate electrode 202g and the active region of the second semiconductor layer 201. The active region may be defined by device isolation layers 204 in the second semiconductor layer 201. The device isolation layers 204 may be formed by a shallow trench isolation (STI) process. Gate spacers 203 are disposed on both sides of the gate electrode 202g, and the gate spacers 203 may electrically insulate the gate electrode 202g from the impurity region 202a. The transistors 202 may be electrically connected to the second through-electrode 232 and the second front bonding pad 215 through the second interconnection layer 206. For example, the impurity region 202a may be connected to the second interconnection layer 206 to be electrically connected to the second through-electrode 232. The second interlayer insulating layer 205 may at least partially cover or surround the transistors 202 and the second interconnection layer 206. The second interlayer insulating layer 205 may include silicon oxide, silicon nitride, silicon oxynitride, or tetraethyl orthosilicate (TEOS).

The second through-structure 230 may penetrate through the second semiconductor layer 201 in the vertical direction (the Z-axis direction), and provide an electrical path connecting the second front bonding pad 215 to the second rear bonding pad 225. The second through-structure 230 may include a second spacer 231 and a second through-electrode 232. The second spacer 231 may include silicon oxide, silicon oxynitride, silicon nitride, a polymer, or a combination thereof, and may be a single layer or multiple layers. As shown in FIG. 2, the second through-electrode 232 may include a conductive plug 232b and a barrier layer 232a surrounding the conductive plug 232b. The barrier layer 232a may include a metal compound such as titanium nitride (TiN), tantalum nitride (TaN), or tungsten nitride (WN). The conductive plug 232b may include, for example, a metallic material such as tungsten (W), titanium (Ti), aluminum (Al), or copper (Cu).

The second rear structure 220 of the lower second semiconductor chip 200A may be bonded to the second front structure 210 of the upper second semiconductor chip 200B. Similarly, the second rear structure 220 of the lower second semiconductor chip 200B may be bonded to the second front structure 210 of the upper second semiconductor chip 200C. As shown in FIG. 2, since the insulating bonding layers disposed vertically at each bonding interface IF are formed of different insulating materials, bonding strength of dielectric-to-dielectric bonding may be improved as described above.

The second front bonding pad 215 may be bonded to the second rear bonding pad 225 to form a portion of the bonding interface IF. The second front bonding pad 215 and the second rear bonding pad 225 may have an asymmetrical structure in which at least one of widths and thicknesses thereof is different from each other. For example, the second rear bonding pad 225 may have a first width W1 and a first thickness T1, and the second front bonding pad 215 may have a second width W2 less than the first width W1 and a second thickness T2 greater than the first thickness T1. Since the first width W1 is greater than the second width W2, an alignment margin between the second front bonding pad 215 and the second rear bonding pad 225 may be secured, and since the second thickness T2 is greater than the first thickness T1, the second front bonding pad 215 and the second rear bonding pad 225 may be stably bonded without a void or an empty space therebetween due to expansion of a metallic material (e.g., copper) during bonding. The second front bonding pad 215 and the second rear bonding pad 225 may include barrier layers 215a and 225a and conductive layers 215b and 225b, respectively. The barrier layers 215a and 225a may include a metal compound such as titanium nitride (TiN), tantalum nitride (TaN), or tungsten nitride (WN). The conductive layers 215b and 225b may include, for example, a metallic material such as tungsten (W), titanium (Ti), aluminum (Al), or copper (Cu).

Meanwhile, the semiconductor package 1000 according to an example embodiment may further include an encapsulant 500 surrounding the second semiconductor chips 200A, 200B, 200C, and 200D on the first semiconductor chip 100. The encapsulant 500 may be disposed on the first semiconductor chip 100 and may encapsulate at least a portion of each of the second semiconductor chips 200A, 200B, 200C, and 200D. As shown in FIG. 1, the encapsulant 500 may be formed to expose an upper surface of the uppermost second semiconductor chip 200D. However, in some embodiments, the encapsulant 500 may be formed to cover the upper surface of the uppermost second semiconductor chip 200D. The encapsulant 500 may include, for example, epoxy mold compound (EMC), but a material of the encapsulant 500 is not particularly limited.

FIGS. 3 to 8 are partially enlarged views illustrating a semiconductor package according to embodiments of the present inventive concept. FIGS. 3 to 8 are enlarged views of a region corresponding to region 'A' of FIG. 1.

Figure 3:
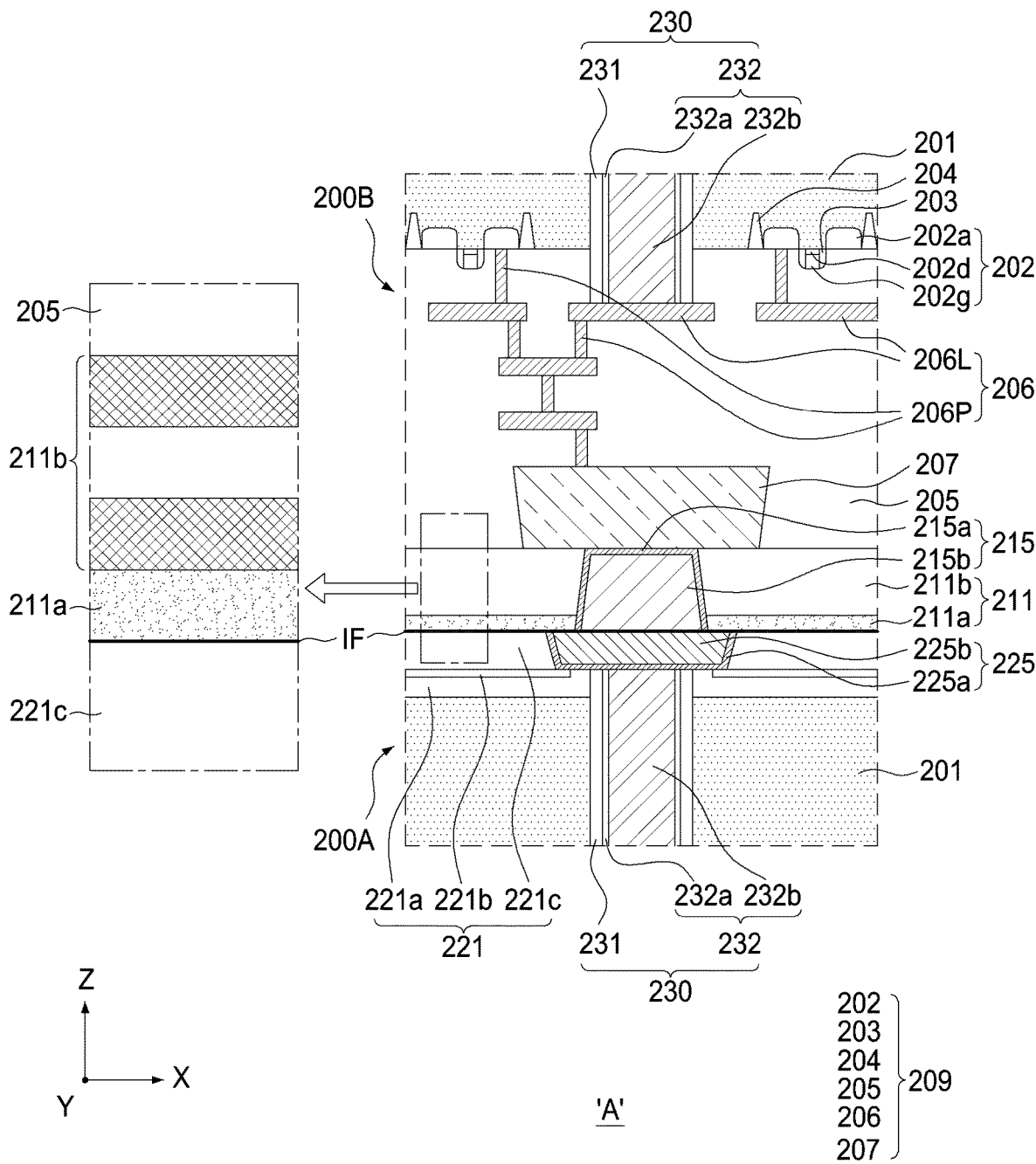
Figure 4:
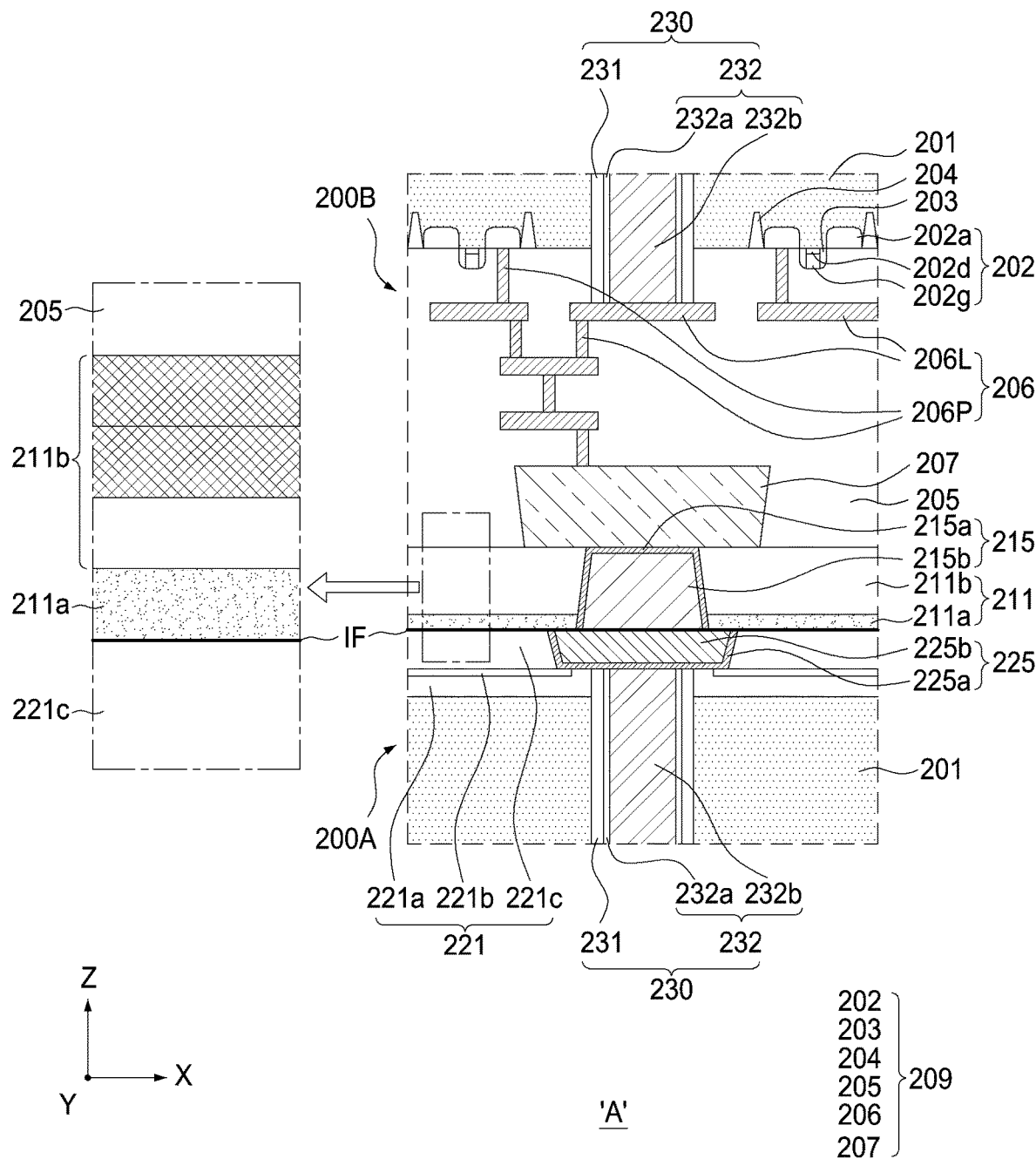

Referring to FIGS. 3 and 4, in the second front structure 210, the second front insulation layer 211 may include a first insulation layer 211a and a plurality of second insulation layers 211b, and compositions of insulating materials of the plurality of second insulating layers 211b may be different. For example, the second rear insulating layer 221 may include a first insulating material, the first insulating layer 211a may include a second insulating material, different from the first insulating material, some of the second insulating layers 211b may include a third insulating material different from the second insulating material, and the other thereof may include a fourth insulating material different from the third insulating material. For example, the first insulating material may be silicon oxide, the second insulating material may be silicon oxycarbonitride, the third insulating material may be silicon carbon nitride, and the fourth insulating material may be silicon oxide. In FIG. 3, the insulating layer including the fourth insulating material may be disposed between the insulating layers including the third insulating material. In FIG. 4, the insulating layer including the fourth insulating material may be disposed between the insulating layer including the third insulating material and the first insulating layer 211a. Bonding strength may be further improved by bonding between heterogeneous insulating layers between layers constituting the second insulating layers 211b.

Figure 5:
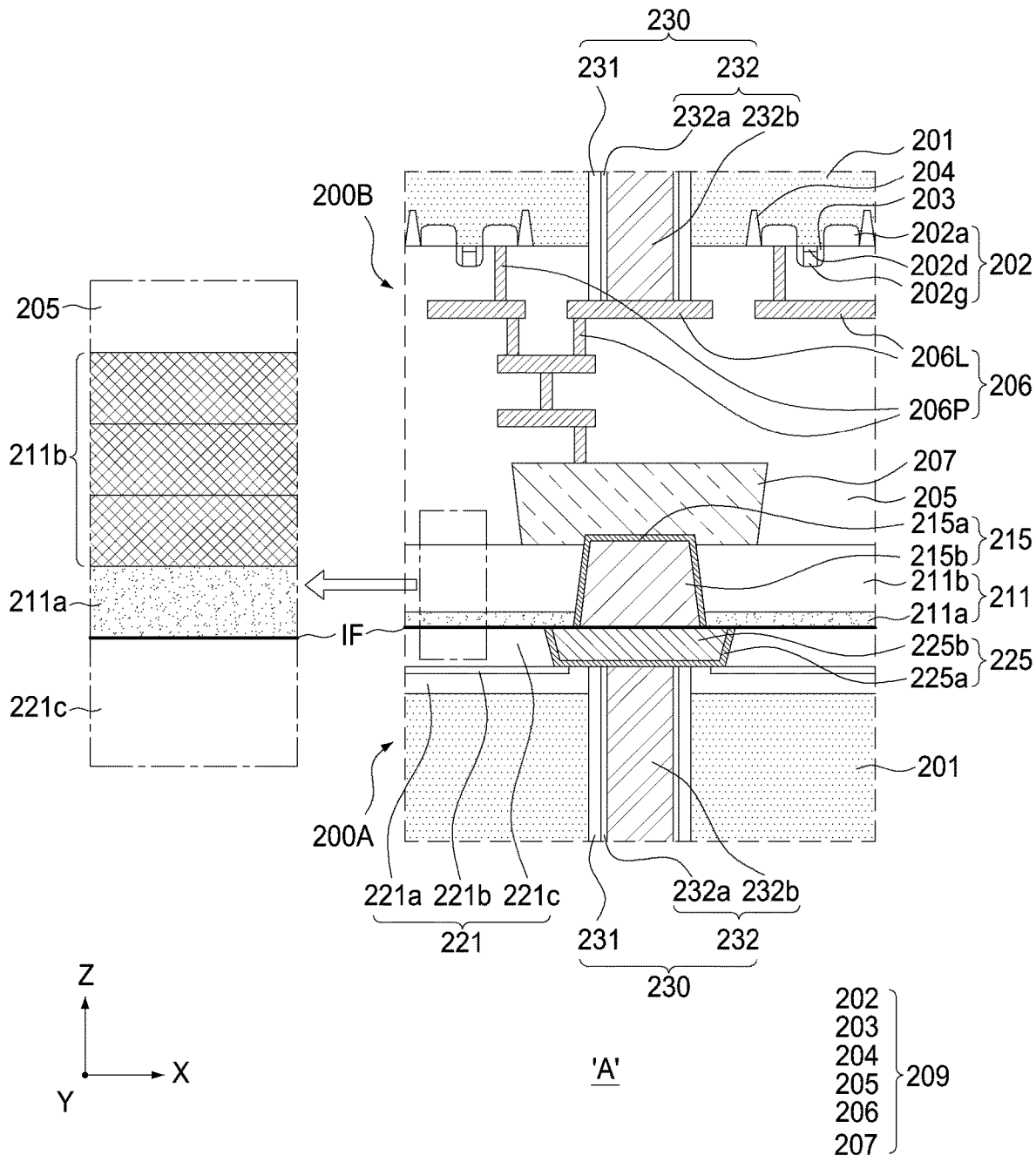

Referring to FIG. 5, in the second front structure 210, the second front bonding pad 215 may recess a lower portion of the interconnection pad 207. The second front bonding pad 215 may be received in a recess in the lower portion of the interconnection pad 207. This may be a structure formed by partially removing a lower portion of the interconnection pad 207 by an etching process in the process of forming an opening by etching the second front insulating layer 211.

Figure 6:
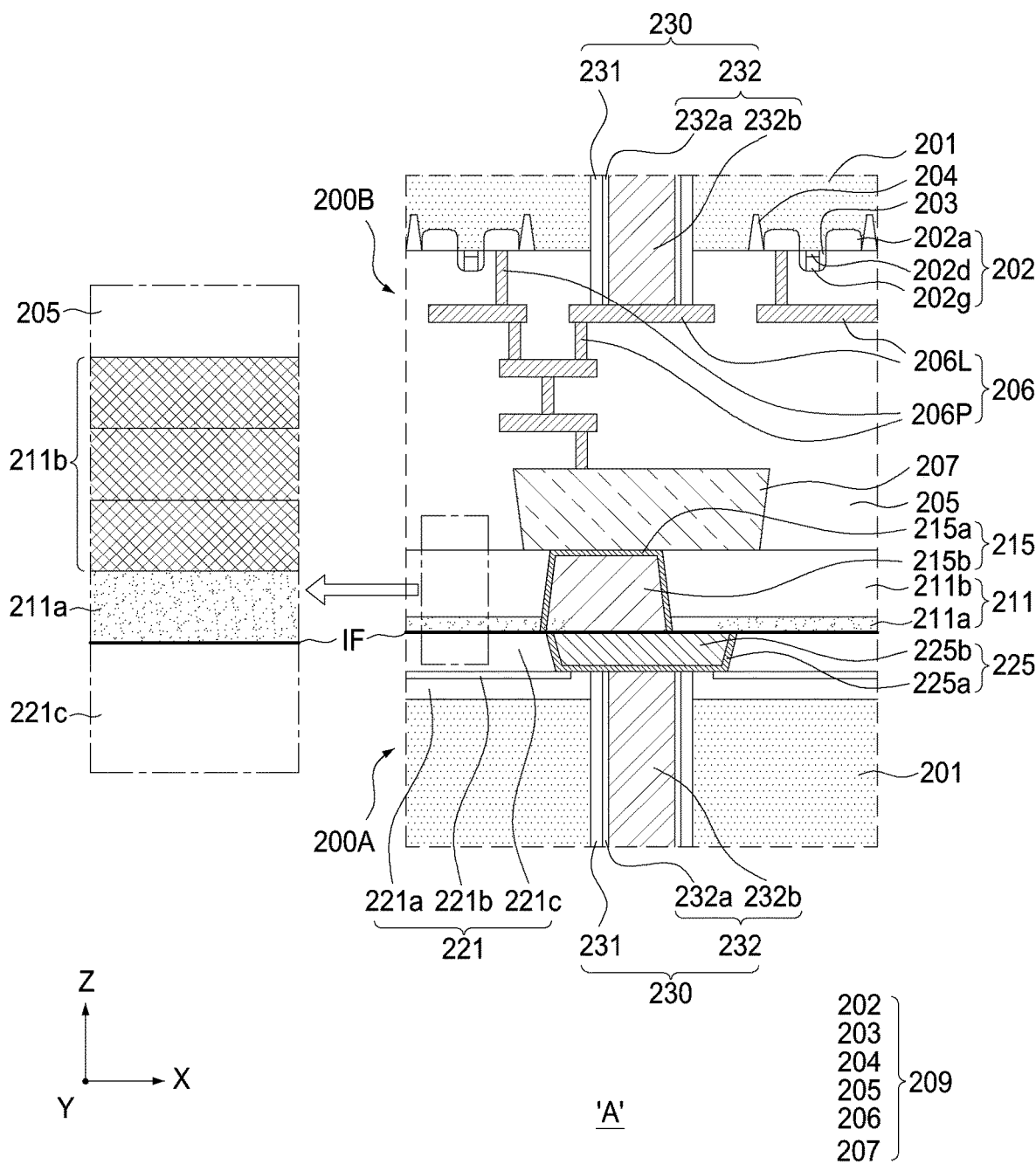

Referring to FIG. 6, a central axis of the second front bonding pad 215 is shifted or offset from a central axis of the second rear bonding pad 225. Since the second width W2 of the second rear bonding pad 225 is greater than the first width W1 of the second front bonding pad 215, even if the central axes are shifted from each other, the second front bonding pad 215 and the second rear bonding pad 225 may be stably bonded.

Figure 7:
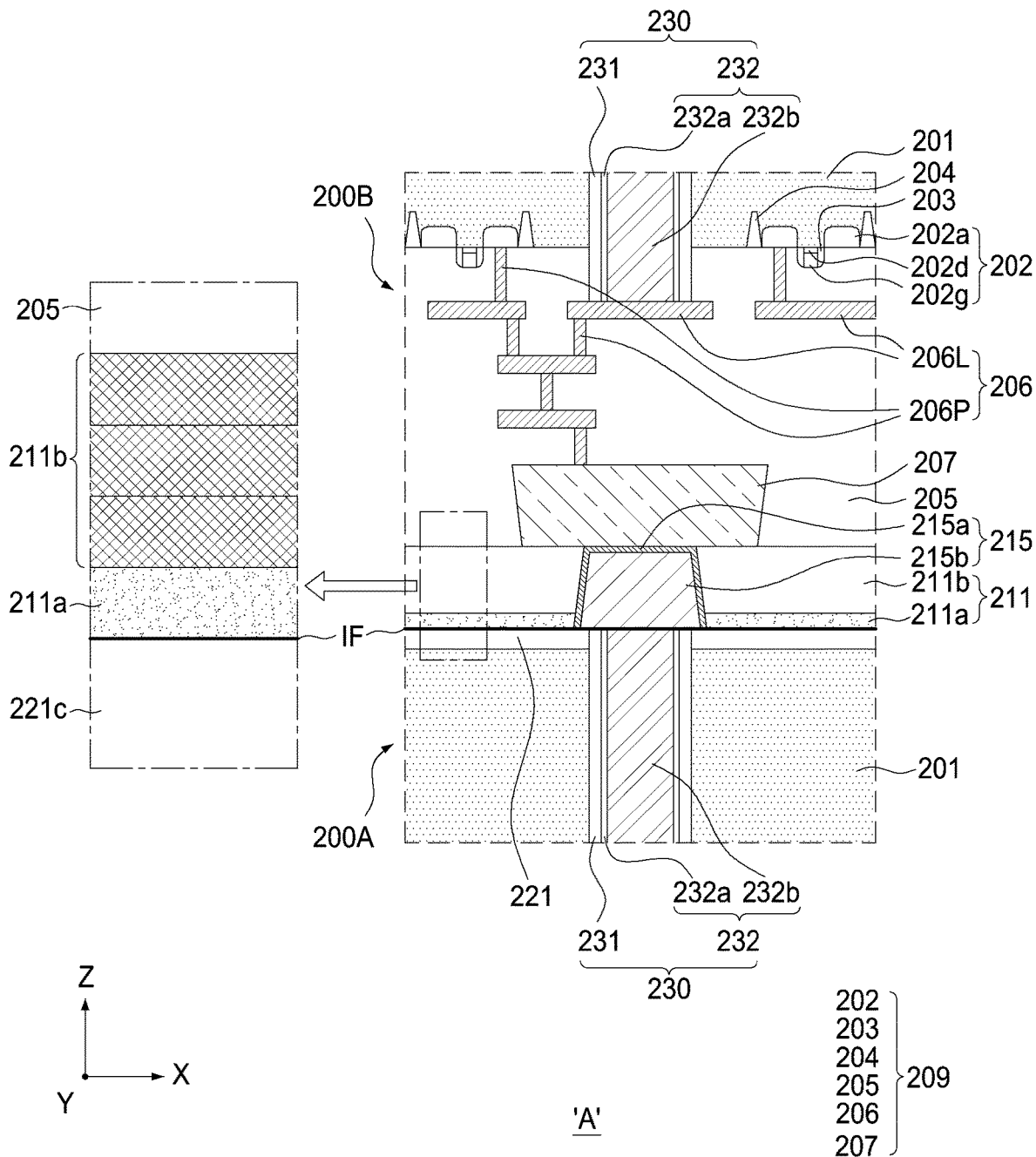

Referring to FIG. 7, the second rear structure 220 does not include the second rear bonding pad 225, and the second through-electrode 232 of the lower second semiconductor chip 200A may be in direct contact with the second front bonding pad 215 of the upper second semiconductor chip 200B. Also in this case, since the second rear insulating layer 221 and the second front insulating layer 211 may include different insulating materials, the dielectric-to-dielectric adhesion may be strong.

Figure 8:
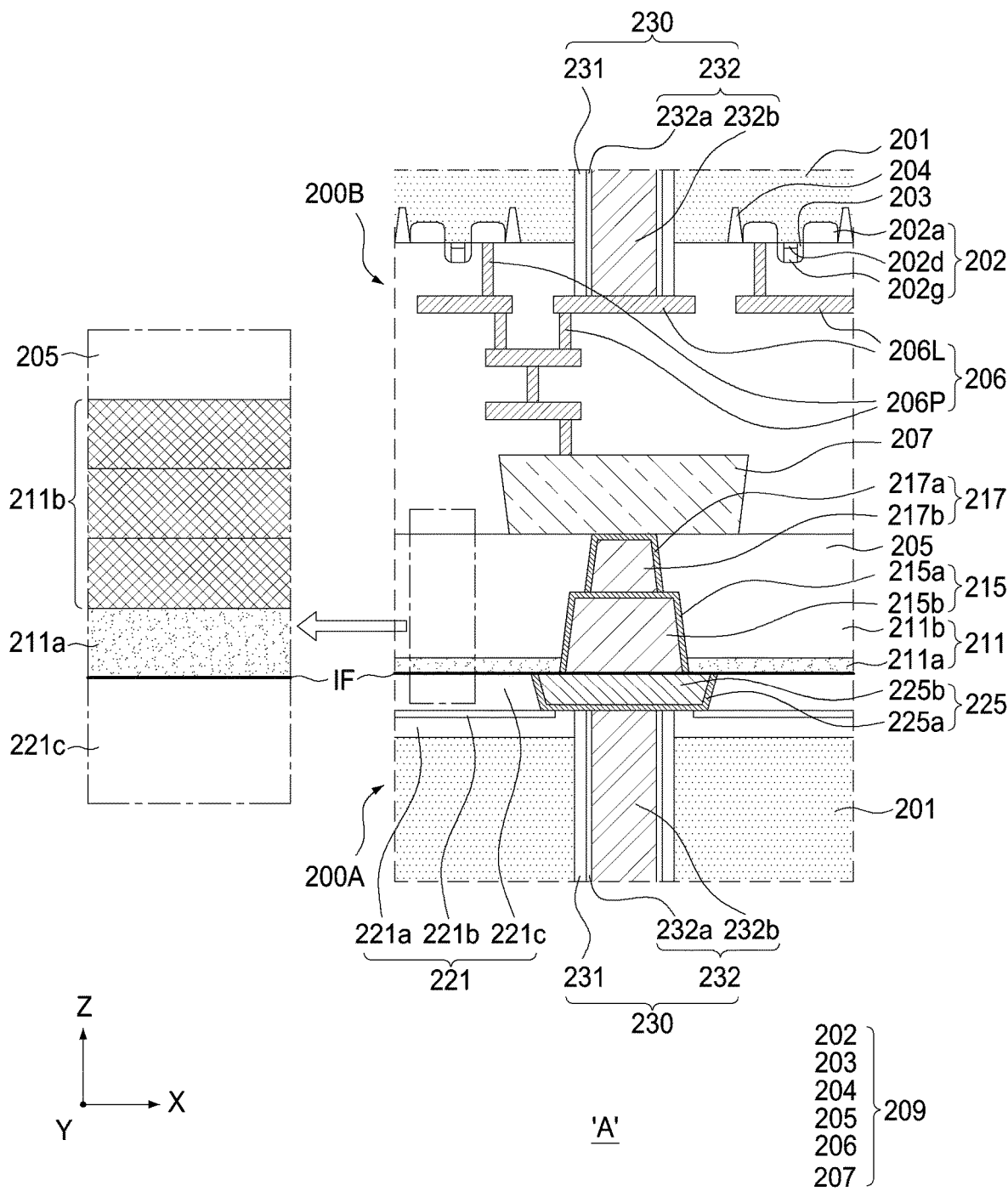

Referring to FIG. 8, the second rear structure 220 may further include a second rear bonding via 217 between the second rear bonding pad 225 and the interconnection pad 207. The second rear bonding via 217 may include a barrier layer 217a and a conductive layer 217b. The second rear bonding via 217 may have a structure and material similar to those of the barrier layer 225a and the conductive layer 227b of the second rear bonding pad 225, and thus, a description thereof is omitted in the interest of brevity.

Figure 9:
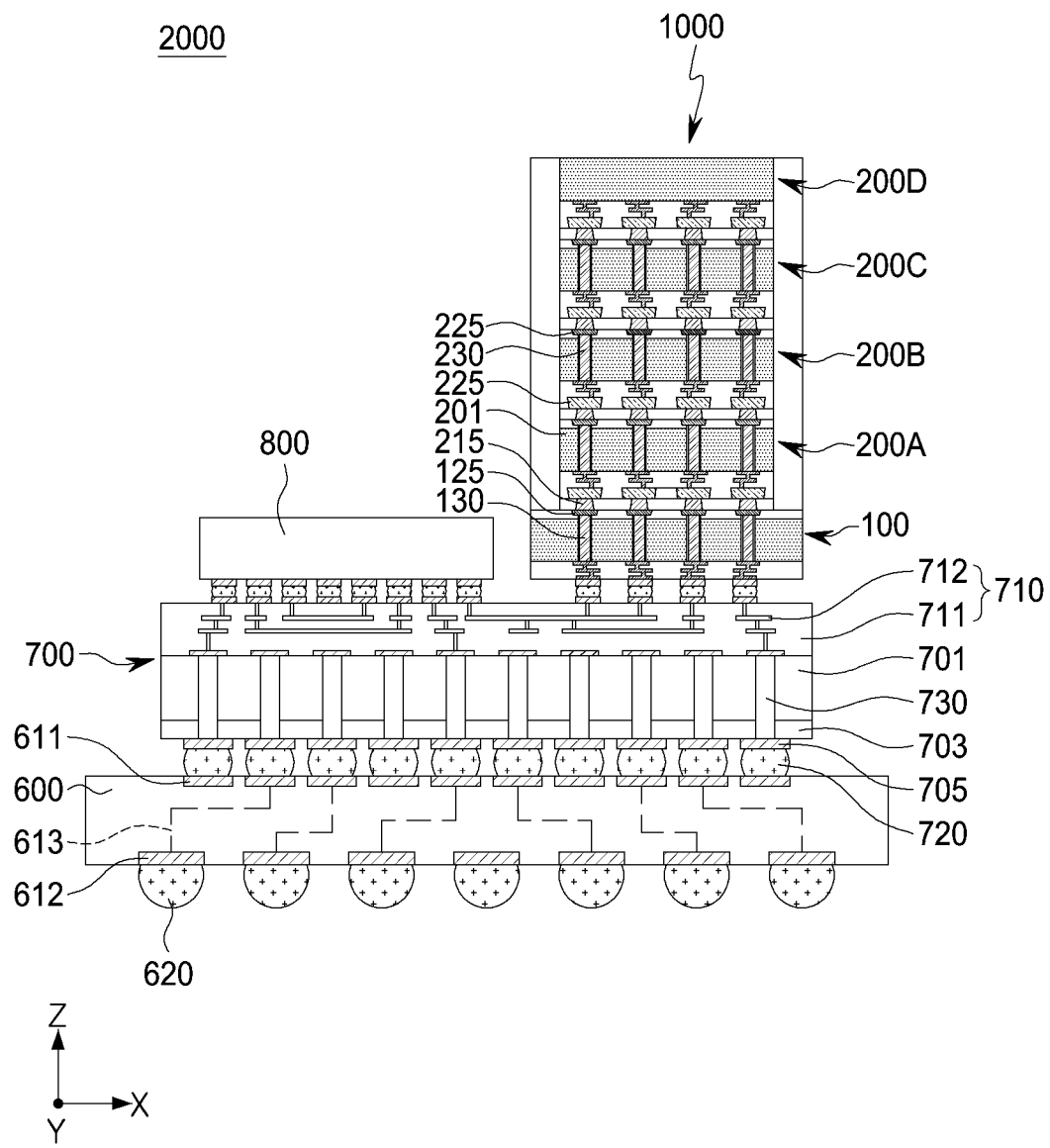
FIG. 9 is a cross-sectional view illustrating a semiconductor package according to an embodiment of the present inventive concept.

FIG. 9 is a cross-sectional view illustrating a semiconductor package according to an embodiment of the present inventive concept.

Referring to FIG. 9, a semiconductor package 2000 according to an example embodiment may include a package substrate 600, an interposer substrate 700, and at least one chip structure 1000. Also, the semiconductor package 2000 may further include a logic chip or a processor chip 800 disposed adjacent to the chip structure 1000 on the interposer substrate 700.

The package substrate 600 may include a lower pad 612 disposed on a lower surface of a body, an upper pad 611 disposed on an upper surface of the body, and a redistribution circuit 613 electrically connecting the lower pad 612 and the upper pad 611 to each other. The package substrate 600 may be a support substrate on which the interposer substrate 700, the logic chip 800, and the chip structure 1000 are mounted, and may be a substrate for a semiconductor package including a printed circuit board (PCB), a ceramic substrate, a glass substrate, a tape interconnection board, and the like. The body of the package substrate 600 may include different materials depending on a type of the substrate. For example, when the package substrate 600 is a PCB, it may be in a form in which an interconnection layer is additionally stacked on one side or both sides of a body copper clad laminate or a copper clad laminate. Solder resist layers may be respectively formed on lower and upper surfaces of the package substrate 600. The lower and upper pads 612 and 611 and the redistribution circuit 613 may form an electrical path connecting the lower surface and the upper surface of the package substrate 600. The lower and upper pads 612 and 611 and the redistribution circuit 613 may be formed of a metallic material, for example, at least one or two or more of copper (Cu), aluminum (Al), nickel (Ni), silver (Ag), or gold (Au), platinum (Pt), tin (Sn), lead (Pb), titanium (Ti), chromium (Cr), palladium (Pd), indium (In), zinc (Zn) and carbon (C) or alloys including two or more metals. The redistribution circuit 613 may include multiple redistribution layers and vias connecting them. An external connection terminal 620 connected to the lower pad 612 may be disposed on the lower surface of the package substrate 600. The external connection terminal 620 may include tin (Sn), indium (In), bismuth (Bi), antimony (Sb), copper (Cu), silver (Ag), zinc (Zn), lead (Pb) and/or alloys thereof.

The interposer substrate 700 may include a substrate 701, a lower passivation layer 703, a lower pad 705, an interconnection structure 710, a metal bump 720, and a through-via 730. The chip structure 1000 and the processor chip 800 may be stacked on the package substrate 600 via the interposer substrate 700. The interposer substrate 700 may electrically connect the chip structure 1000 and the processor chip 800 to each other.

The substrate 701 may be formed of, for example, any one of silicon, an organic material, plastic, and a glass substrate. When the substrate 701 is a silicon substrate, the interposer substrate 700 may be referred to as a silicon interposer. Also, when the substrate 701 is an organic substrate, the interposer substrate 700 may be referred to as a panel interposer.

The lower passivation layer 703 may be disposed on a lower surface of the substrate 701, and the lower pad 705 may be disposed on the lower passivation layer 703. The lower pad 705 may be connected to the through-via 730. The chip structure 1000 and the processor chip 800 may be electrically connected to the package substrate 600 through the metal bumps 720 disposed on the lower pad 705.

The interconnection structure 710 may be disposed on an upper surface of the substrate 701, and may include an interlayer insulating layer 711 and a single-layer or multi-layer interconnection 712. When the interconnection structure 710 has a multilayer interconnection structure, interconnection patterns of different layers may be connected to each other through contact vias.

The through-via 730 may extend from the upper surface to the lower surface of the substrate 701 to penetrate through the substrate 701. In addition, the through-via 730 may extend into the interconnection structure 710 to be electrically connected to the interconnections of the interconnection structure 710. When the substrate 701 is silicon, the through-via 730 may be referred to as a TSV. Other structures and materials of the through-via 730 are the same as those described for the semiconductor package 1000 of FIG. 1. According to an embodiment, the interposer substrate 700 may include only an interconnection structure therein, but may not include a through-via.

The interposer substrate 700 may be used for the purpose of converting or transferring an input electrical signal between the package substrate 600 and the chip structure 1000 or the processor chip 800. Accordingly, the interposer substrate 700 may not include elements such as active elements or passive elements. Also, according to an embodiment, the interconnection structure 710 may be disposed below the through-via 730. For example, a positional relationship between the interconnection structure 710 and the through-via 730 may be relative.

The metal bump 720 may be disposed on a lower surface of the interposer substrate 700 and may be electrically connected to the interconnection of the interconnection structure 710. The interposer substrate 700 may be stacked on the package substrate 600 through the metal bump 720. The metal bump 720 may be connected to the lower pad 705 through interconnections of the interconnection structure 710 and the through-via 730. In one example, some of the lower pads 705 used for power or ground may be integrated and connected together to the metal bump 720, so that the number of the lower pads 705 may be more than the number of the metal bump 720.

The logic chip or processor chip 800 may be, for example, a central processor (CPU), a graphics processor (GPU), a field programmable gate array (FPGA), a digital signal processor (DSP), a cryptographic processor, a microprocessor, a microcontroller, an analog-to-digital converter (ADC), an application-specific IC (ASIC), and the like. Depending on the types of devices included in the logic chip 800, the semiconductor package 2000 may be referred to as a server-oriented semiconductor package or a mobile-oriented semiconductor package.

The chip structure 1000 may have characteristics similar to those of the semiconductor package 1000 described with reference to FIGS. 1 to 8. For example, the chip structure 1000 has a structure in which the first semiconductor chip 100 and the second semiconductor chips 200A, 200B, 200C, and 200D are directly bonded, and the rear bonding pad 225 and the front bonding pad 215 of the second semiconductor chips 200A, 200B, 200C, and 200D may be directly bonded, and the second rear insulating bonding layer 221 may be formed of an insulating material different from that of the front insulating bonding layer 211.

Meanwhile, the semiconductor package 2000 may further include an internal sealing material covering or surrounding side surfaces and upper surfaces of the chip structure 1000 and the processor chip 800 on the interposer substrate 700. In addition, the semiconductor package 2000 may further include an external sealing material covering or surrounding the interposer substrate 700 and the internal sealing material on the package substrate 600. The external sealing material and the internal sealing material may be formed together and thus indistinguishable. According to an embodiment, the semiconductor package 2000 may further include a heat sink covering the chip structure 1000 and the processor chip 800 on the package substrate 600.

Figure 10:
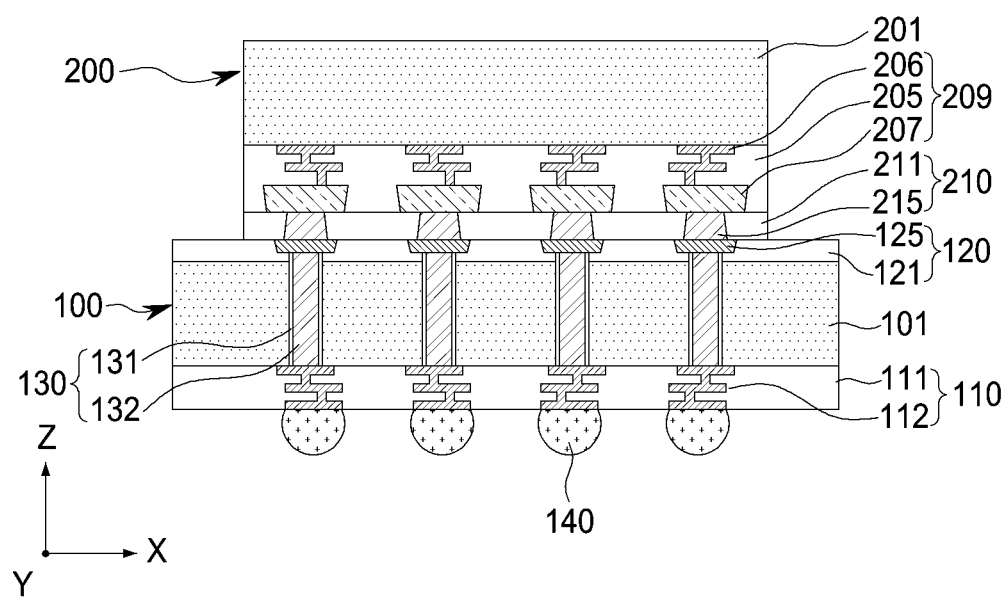
FIG. 10 is a cross-sectional view illustrating a semiconductor package according to an embodiment of the present inventive concept.

FIG. 10 is a cross-sectional view illustrating a semiconductor package according to an embodiment of the present inventive concept.

Referring to FIG. 10, a semiconductor package 3000A may include a first semiconductor chip 100 and a second semiconductor chip 200 stacked in a vertical direction. The first semiconductor chip 100 and the second semiconductor chip 200 may be coupled by direct bonding without a separate connection member. Since the first semiconductor chip 100 has the same structure as that of the first semiconductor chip 100 of FIGS. 1 and 2, a description thereof will be omitted in the interest of brevity. However, the first device layer 110 of the first semiconductor chip 100 may include individual devices, and the individual devices may include FETs such as planar FETs or FinFETs, memory devices such as a flash memory, DRAM, SRAM, and EEPROM, PRAM, MRAM, FeRAM, RRAM, etc., logic devices such as AND, OR, NOT, and various active elements and/or passive elements such as system LSI, CIS, MEMS. The second semiconductor chip 200 may be configured as a single chip and may not include the second through-structure 230. However, the second semiconductor chip 200 may have a second semiconductor layer 201 and a second front structure 210 similar to those described above with reference to FIGS. 1 and 2, and the second front structure 210 may be bonded to the first rear structure 120 of the first semiconductor chip 100. In an example embodiment, the second semiconductor chip 200 may be a chiplet constituting a multi-chip module (MCM), but is not limited thereto.

Figure 11:
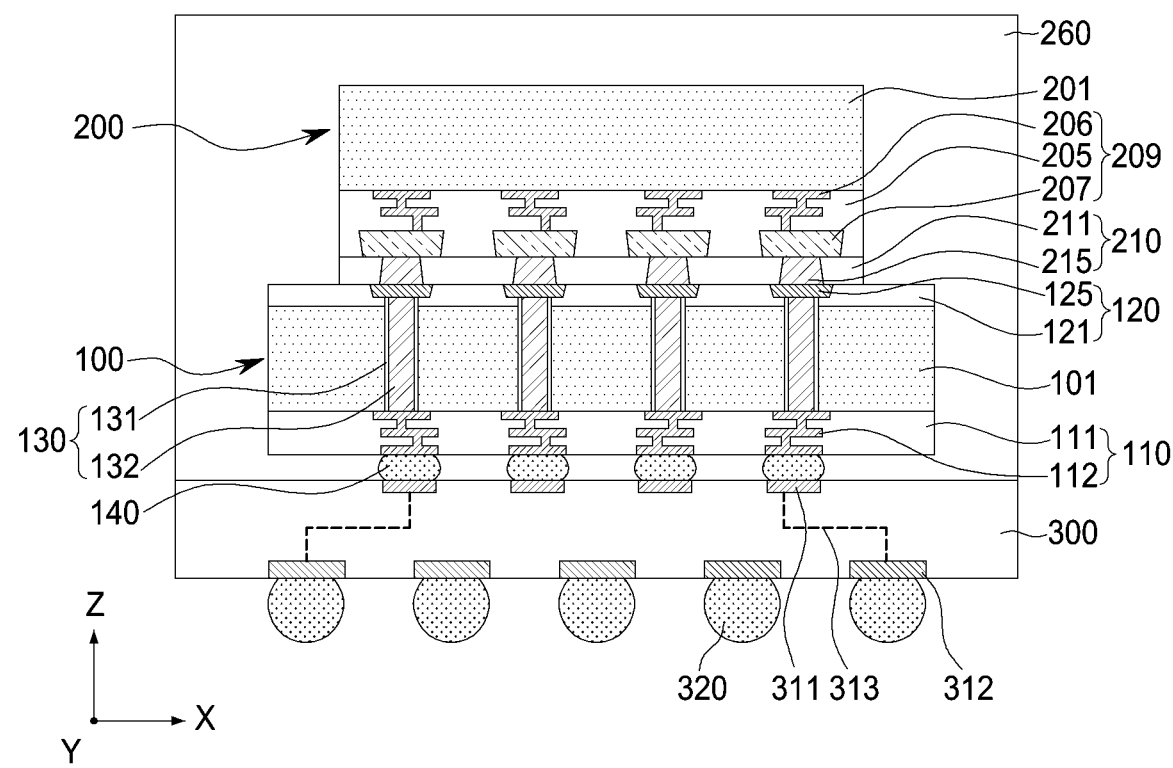
FIG. 11 is a cross-sectional view illustrating a semiconductor package according to an embodiment of the present inventive concept.

FIG. 11 is a cross-sectional view illustrating a semiconductor package according to an embodiment of the present inventive concept.

Referring to FIG. 11, a semiconductor package 3000B may have characteristics the same as or similar to those described above with reference to FIG. 10, except that the semiconductor package 3000B further includes a package substrate 300 on which the first semiconductor chip 100 is mounted and an encapsulant 260 encapsulating the first semiconductor chip 100 and the second semiconductor chip 200 on the package substrate 300.

As an example, the first semiconductor chip 100 may include, for example, a central processor (CPU), a graphics processor (GPU), a field programmable gate array (FPGA), an application processor (AP), a digital signal processor (DSP), a cryptographic processor, a microprocessor, a microcontroller, an analog-to-digital converter, an application specific integrated circuit (ASIC), and the like. Also, the second semiconductor chip 200 may include a memory chip such as DRAM, SRAM, PRAM, MRAM, FeRAM, or RRAM. In this embodiment, the second semiconductor chip 200 has a shape illustrated in FIG. 10, but may also have a shape similar to that described above with reference to FIGS. 1 to 8. For example, the second semiconductor chip 200 may include a power management IC (PMIC) chip.

Figure 12:
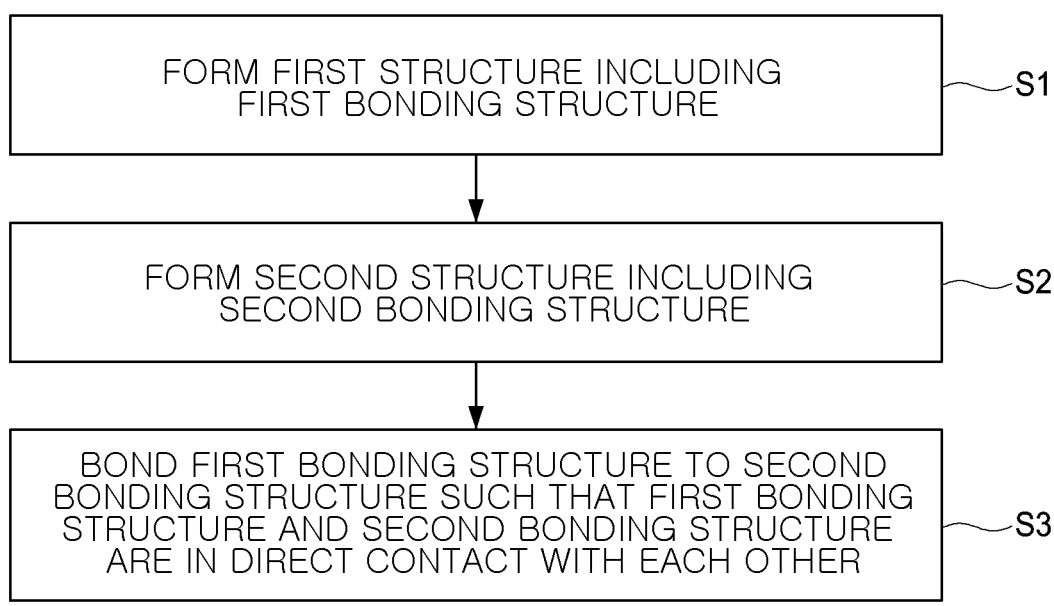
FIG. 12 is a flowchart illustrating a sequential process of a method of manufacturing a semiconductor package according to an embodiment of the present inventive concept.

FIG. 12 is a flowchart illustrating a sequential process of a method of manufacturing a semiconductor package according to an embodiment of the present inventive concept.

Figure 13:
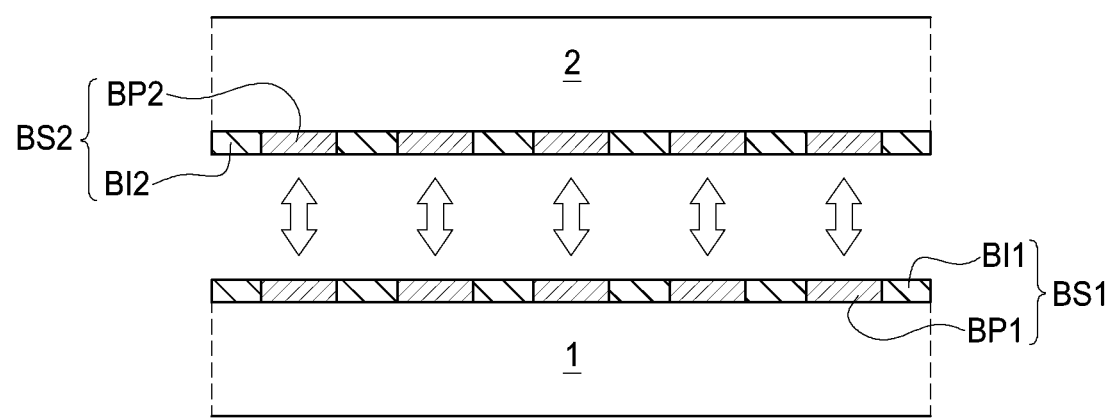
FIG. 13 illustrates a bonding process of a first structure and a second structure in order to illustrate a method of manufacturing a semiconductor package according to an embodiment of the present inventive concept.

FIG. 13 illustrates a process of bonding a first structure and a second structure in order to illustrate a method of manufacturing a semiconductor package according to an embodiment of the present inventive concept.

Referring to FIGS. 12 and 13, a first structure 1 including a first bonding structure BS1 is formed (S1), a second structure 2 including a second bonding structure BS2 is formed (S2), and the first structure 1 and the second structure 2 may be bonded so that the first bonding structure BS1 and the second bonding structure BS2 are in direct contact with each other (S3).

The first bonding structure BS1 may include a first bonding pad BP1 and a first insulating bonding layer BI1 surrounding at least a portion of a side surface of the first bonding pad BP1, and the second bonding structure BS2 may include a second bonding pad BP2 and a second insulating bonding layer BI2 surrounding at least a portion of a side surface of the second bonding pad BP2. The first bonding pad BP1 and the second bonding pad BP2 may be in contact with each other and may be bonded by copper-to-copper bonding. The first insulating bonding layer BI1 and the second insulating bonding layer BI2 may be in contact with each other and may be bonded by dielectric-to-dielectric bonding. The first bonding structure BS1 and the second bonding structure BS2 may be electrically connected to a redistribution layer or a through-via disposed in each of the first structure 1 and the second structure 2.

In an example embodiment, the bonding of the first structure 1 and the second structure 2 may be die-to-die bonding, die-to-wafer bonding, or a wafer-to-wafer bonding. For example, when each of the first structure 1 and the second structure 2 is a semiconductor chip, bonding of the first structure 1 and the second structure 2 may be die-to-die bonding. For example, when the first structure 1 is one of a plurality of semiconductor structures divided by scribe lanes on a semiconductor wafer and the second structure 2 is a semiconductor chip disposed on each of the plurality of semiconductor structures, bonding of the first structure 1 and the second structure 2 may be die-to-wafer bonding. For example, when the first structure 1 and the second structure are one of a plurality of semiconductor structures divided by scribe lanes on each of the first semiconductor wafer and the second semiconductor wafer, bonding of the first structure 1 and the second structure 2 may be wafer-to-wafer bonding.

Hereinafter, a method for manufacturing the first structure 1 and the second structure 2 will be described.

FIGS. 14A to 14H are cross-sectional views illustrating a sequential manufacturing process of a semiconductor chip according to an example embodiment of the present inventive concept. FIGS. 14A to 14H illustrate a process from dicing a wafer to forming a plurality of semiconductor chips including a second semiconductor chip, and FIGS. 14C to 14F are enlarged views of region 'B' of FIG. 14B.

Figure 14A:
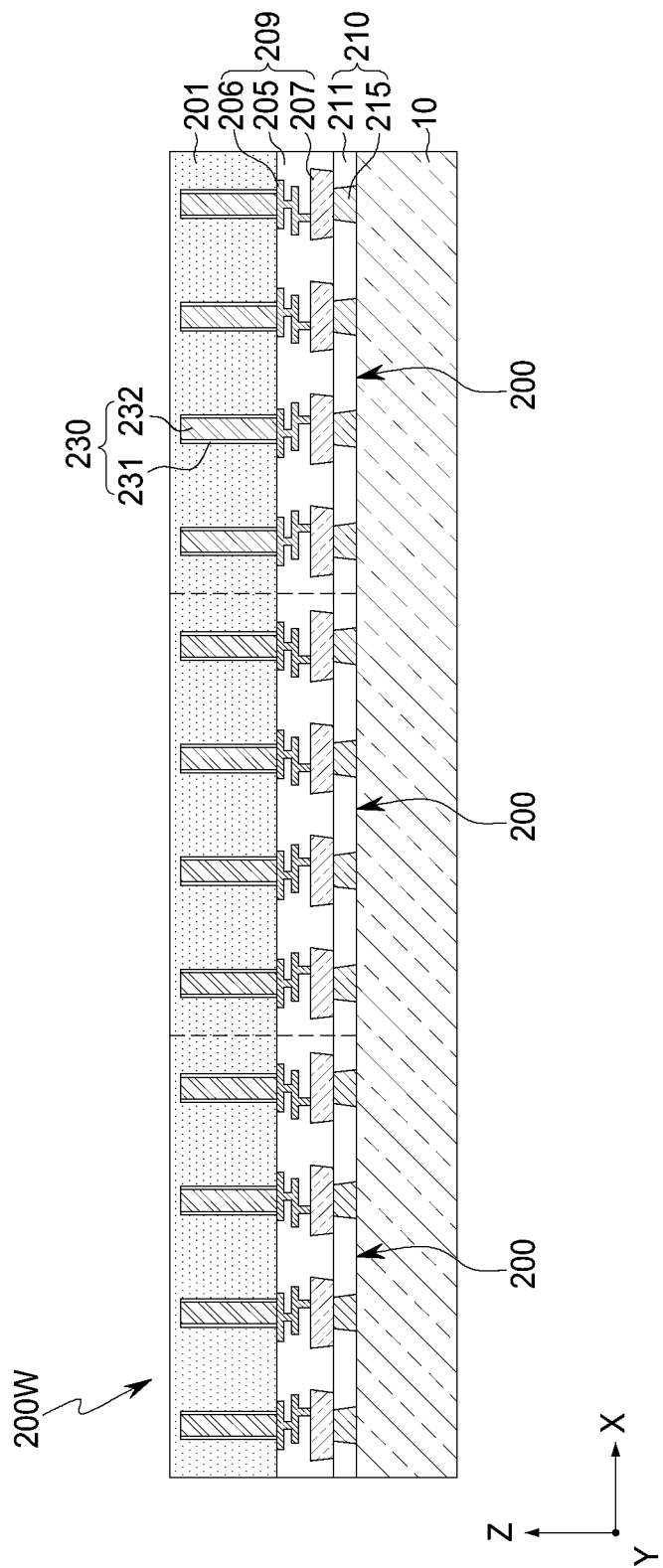
FIGS. 14A to 14H are cross-sectional views sequentially illustrating a sequential process of manufacturing a semiconductor chip according to an example embodiment of the present inventive concept.

Referring to FIG. 14A, a second semiconductor wafer 200W for the plurality of second semiconductor chips 200 may be temporarily bonded to be supported on a first carrier 10 using a bonding material layer. The second semiconductor wafer 200W may be bonded such that a surface on which the second device layer 209 and the second front structure 210 are formed faces the first carrier 10, and the second semiconductor wafer 200W may be stably supported by an adhesive material layer such as glue during a subsequent process. The second semiconductor wafer 200W may be in a state in which some components for the second semiconductor chips 200 are formed. For example, the second semiconductor wafer 200W may include a second device layer 209, a second front structure 210, and a second through-structure 230 disposed on one surface of the second semiconductor layer 201. The second through-structure 230 may be formed to have a depth that does not completely penetrate through the second semiconductor wafer 200W. Referring to FIG. 2, a plurality of second front insulating layers 211 including a plurality of insulating layers including a material, e.g., silicon carbon nitride, different from that of the second rear insulating layer 221 of the second rear structure 220 may be formed. The second front pad 215 may be formed by a damascene method in which the second front insulating layer 211 is opened, filled with a conductive material, and subjected to a polishing process.

The second through-structure 230 may be formed of, for example, a via-middle structure. However, the structure of the second through-structure 230 is not limited thereto, and may be formed in a via-first or via-last structure. The via-first refers to a structure in which the second through-structure 230 is first formed before the individual devices of the second device layer 209 are formed, the via-middle refers to a structure in which the individual devices are formed and then the second through-structure 230 is formed before the second device layer 209 is formed, and the via-last refers to a structure in which the second through-structure 230 is formed after all the second device layers 209 are formed.

Figure 14B:
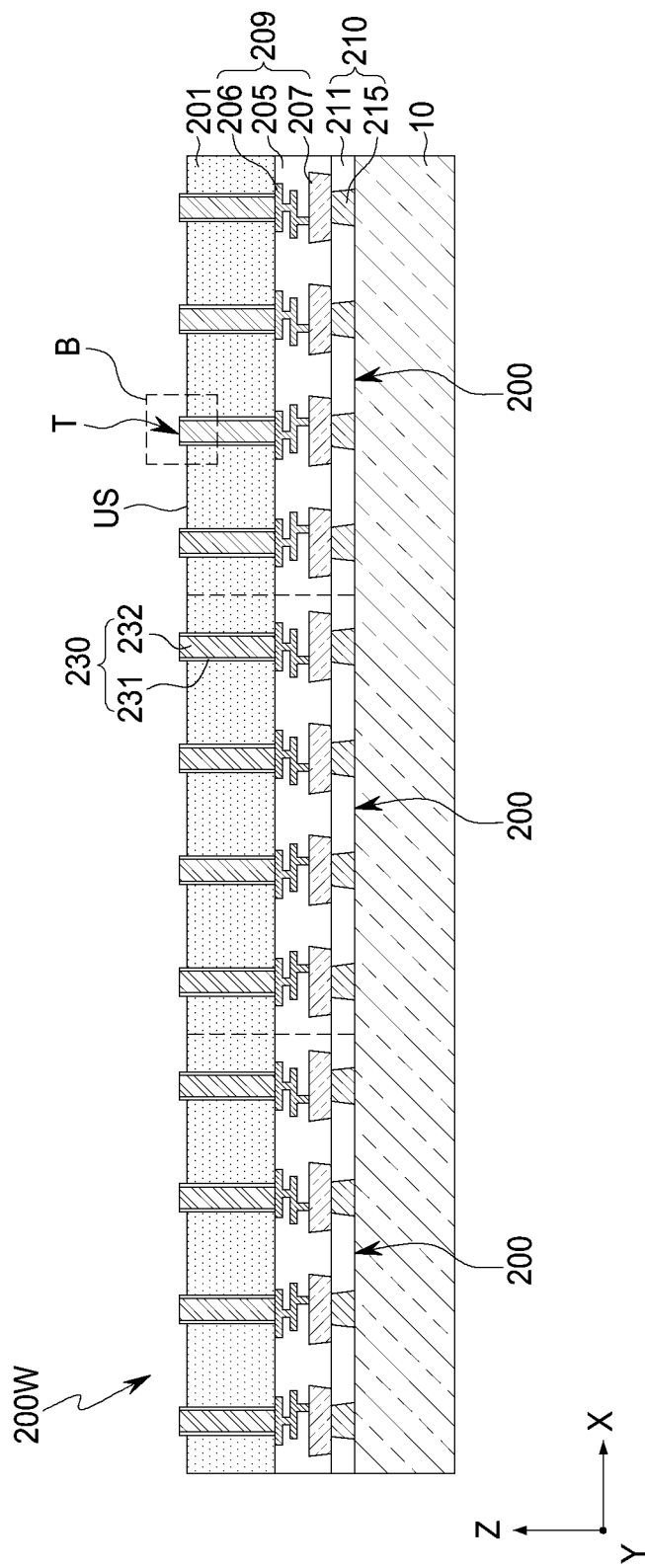

Referring to FIG. 14B, a thickness of the second semiconductor wafer 200W may be reduced by performing a polishing process on an upper surface US of the second semiconductor wafer 200W. Accordingly, the upper surface US of the second semiconductor wafer 200W may be formed below an upper end T of the second through-structure 230. As a portion of the second semiconductor wafer 200W is removed, the upper end T of the second through-structure 230 may protrude from the upper surface US of the second semiconductor wafer 200W. Through the polishing process, the thickness of the second semiconductor wafer 200W may be reduced to a desired thickness of the second semiconductor chips 200. As the polishing process, a grinding process such as a chemical mechanical polishing (CMP) process, an etch-back process, or a combination thereof may be used. For example, a predetermined thickness of the second semiconductor wafer 200W may be reduced by performing a grinding process, and the second through-structure 230 may be sufficiently exposed by applying etchback of appropriate conditions.

FIGS. 14C to 14F are enlarged and detailed views illustrating a process of forming the rear structure 220 in a state in which the upper end T of the second through-structure 230 is exposed in FIG. 14B. FIGS. 14C to 14F show regions corresponding to region 'B' in FIG. 14B.

Figure 14C:
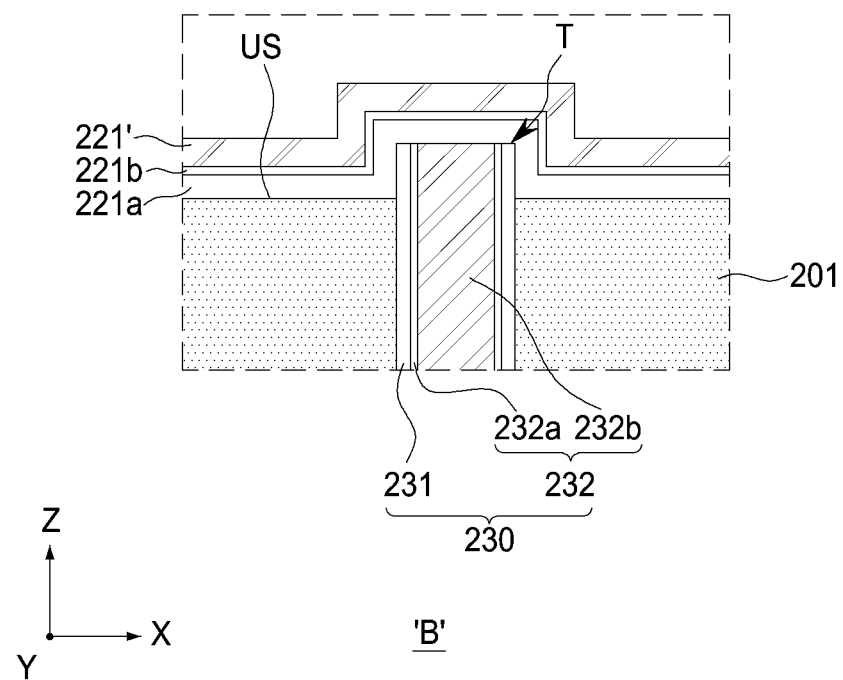

Referring to FIG. 14C, the first insulating layer 221a covering an upper surface and a portion of the second through-structure 230 exposed to the second semiconductor chip 200 and extending along an upper surface (inactive surface) of the second semiconductor layer 201 may be formed. A second insulating layer 221b including a material different from that of the first insulating layer 221a may be formed on the first insulating layer 221a. A sacrificial insulating layer 221' including a material different from that of the second insulating layer 221b may be formed on the second insulating layer 221b. The first insulating layer 221a may be formed of silicon oxide, the second insulating layer 221b may be formed of silicon nitride, and the sacrificial insulating layer 221' may be formed of silicon oxide, but are not limited thereto. Since the upper end T of the second through-structure 230 protrudes from the upper surface US of the second semiconductor layer 201, the first insulating layer 221a, the second insulating layer 221b, and the sacrificial insulating layer 221' may each be bent or stepped along the side surface and the upper surface of the second through-structure 230.

Figure 14D:
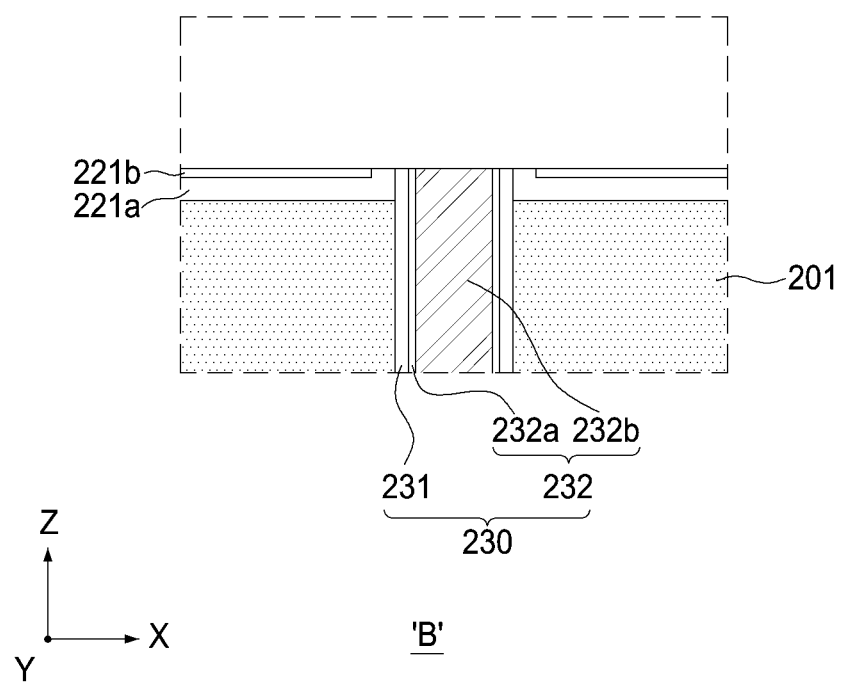

Referring to FIG. 14D, a portion of the first insulating layer 221a, a portion of the second insulating layer 221b, and the sacrificial insulating layer 221' protruding onto the second through-structure 230 may be removed by performing a polishing process. Through the polishing process, an upper surface of the first insulating layer 131a, an upper surface of the second insulating layer 131b, and an upper surface of the second through-structure 230 may be substantially coplanar.

Figure 14E:
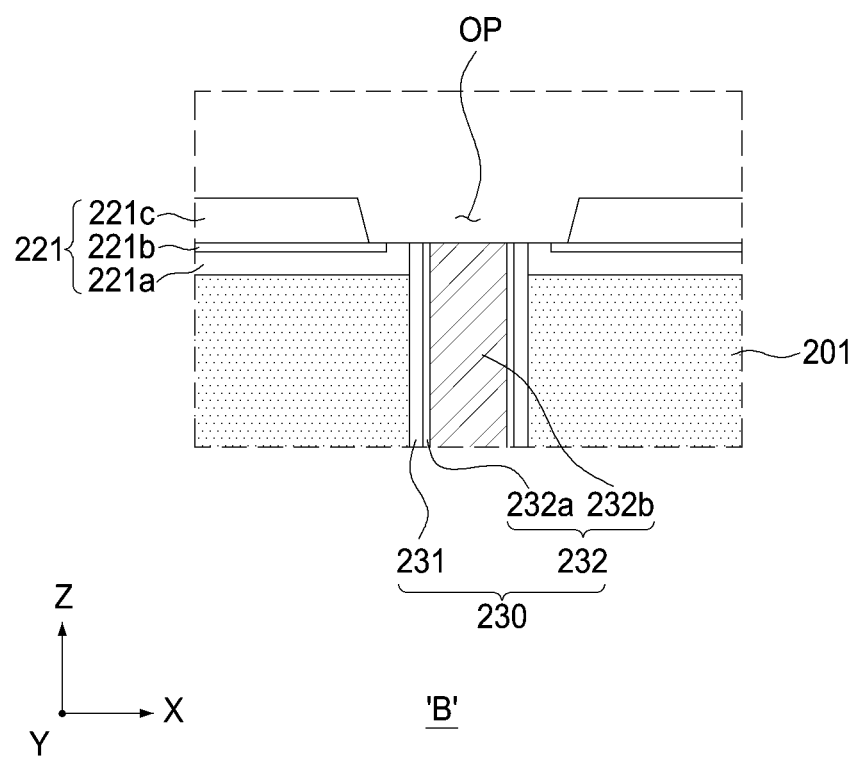

Referring to FIG. 14E, a third insulating layer 221c may be formed on the second insulating layer 221b, and the third insulating layer 221c may be patterned to form an opening OP exposing the upper surface of the second through-structure 230. Accordingly, the rear insulating layer 221 including the first insulating layer 221a, the second insulating layer 221b, and the third insulating layer 221c having the opening OP may be formed.

Figure 14F:
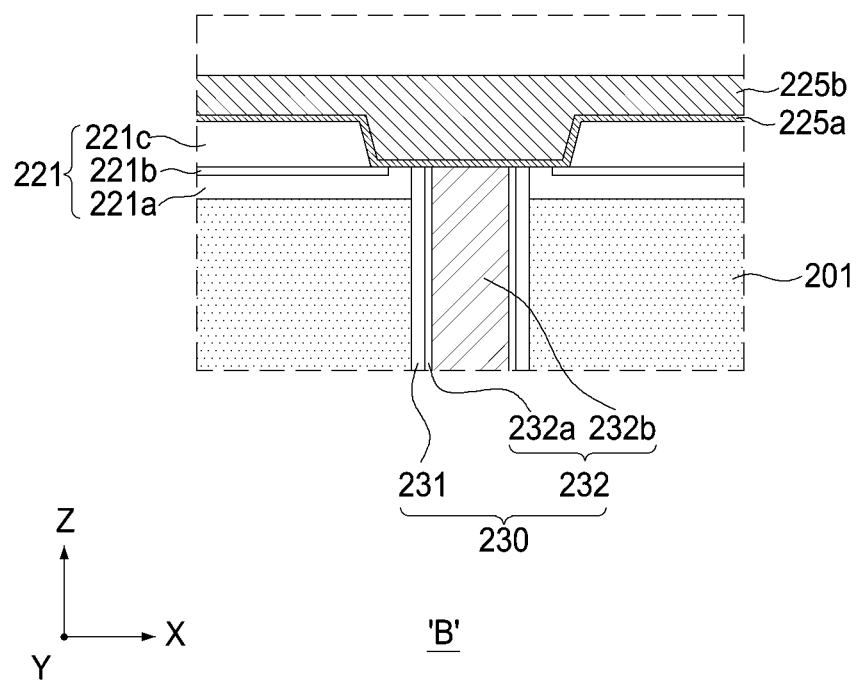

Referring to FIG. 14F, a barrier layer 225a and a conductive layer 225b may be formed on the second rear insulating layer 221 and the second through-structure 230. The barrier layer 225a may substantially conformally cover an inner surface and a bottom surface of the opening OP. The barrier layer 225a may cover the second rear insulating layer 221 in the opening OP and horizontally extend along the upper surface of the second rear insulating layer 221. The barrier layer 225a may be used as a seed layer and a diffusion barrier layer in a plating process for forming the conductive layer 225b. The barrier layer 225a may be formed of, for example, at least one of titanium (Ti), titanium nitride (TiN), tantalum (Ta), tantalum nitride (TaN), and copper (Cu). The conductive layer 225b may be formed on the barrier layer 225a.

Thereafter, a polishing process may be performed until the upper surface of the second rear insulating layer 221 of the second rear structure 220 is exposed.

Figure 14G:
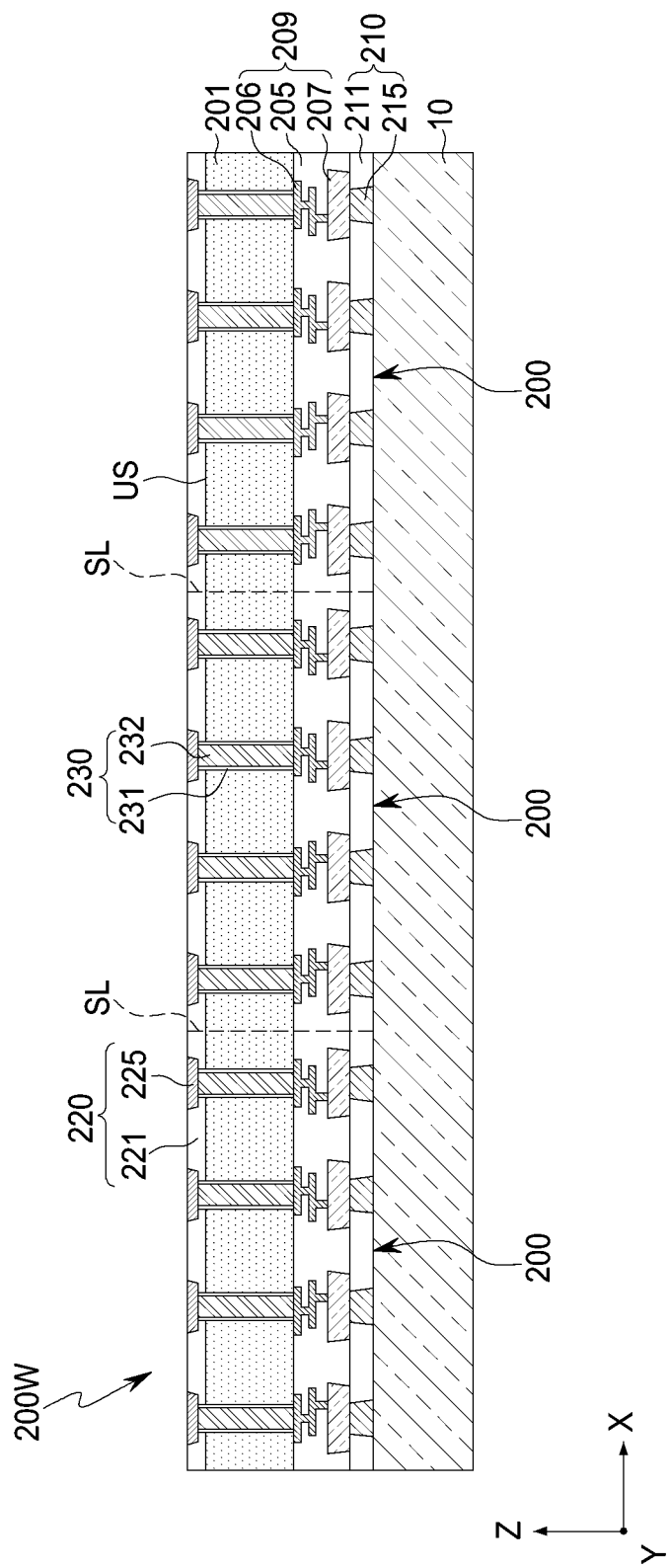

Accordingly, referring to FIG. 14G, the second rear bonding pad 225 including the barrier layer 225a and the conductive layer 225b may be formed.

Figure 14H:
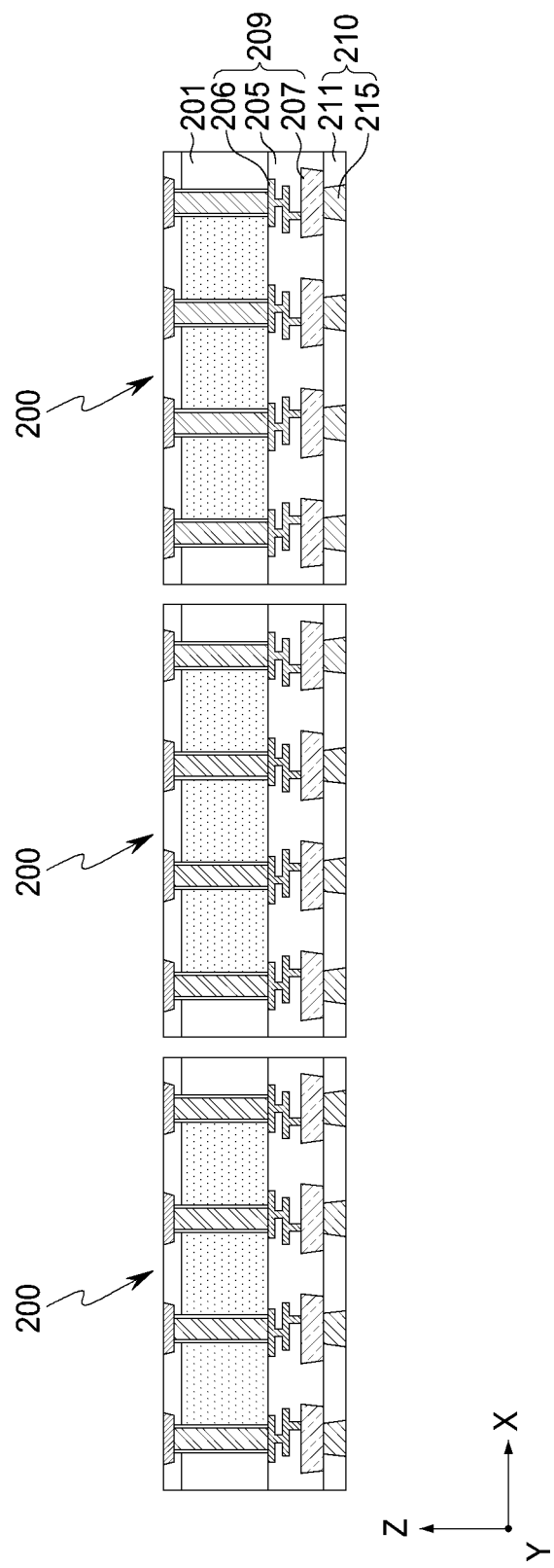

Referring to FIG. 14H, the second semiconductor wafer 200W may be cut along the scribe line SL to be separated into a plurality of second semiconductor chips 200. Thereafter, the first carrier 10 may be removed.

Figure 15:
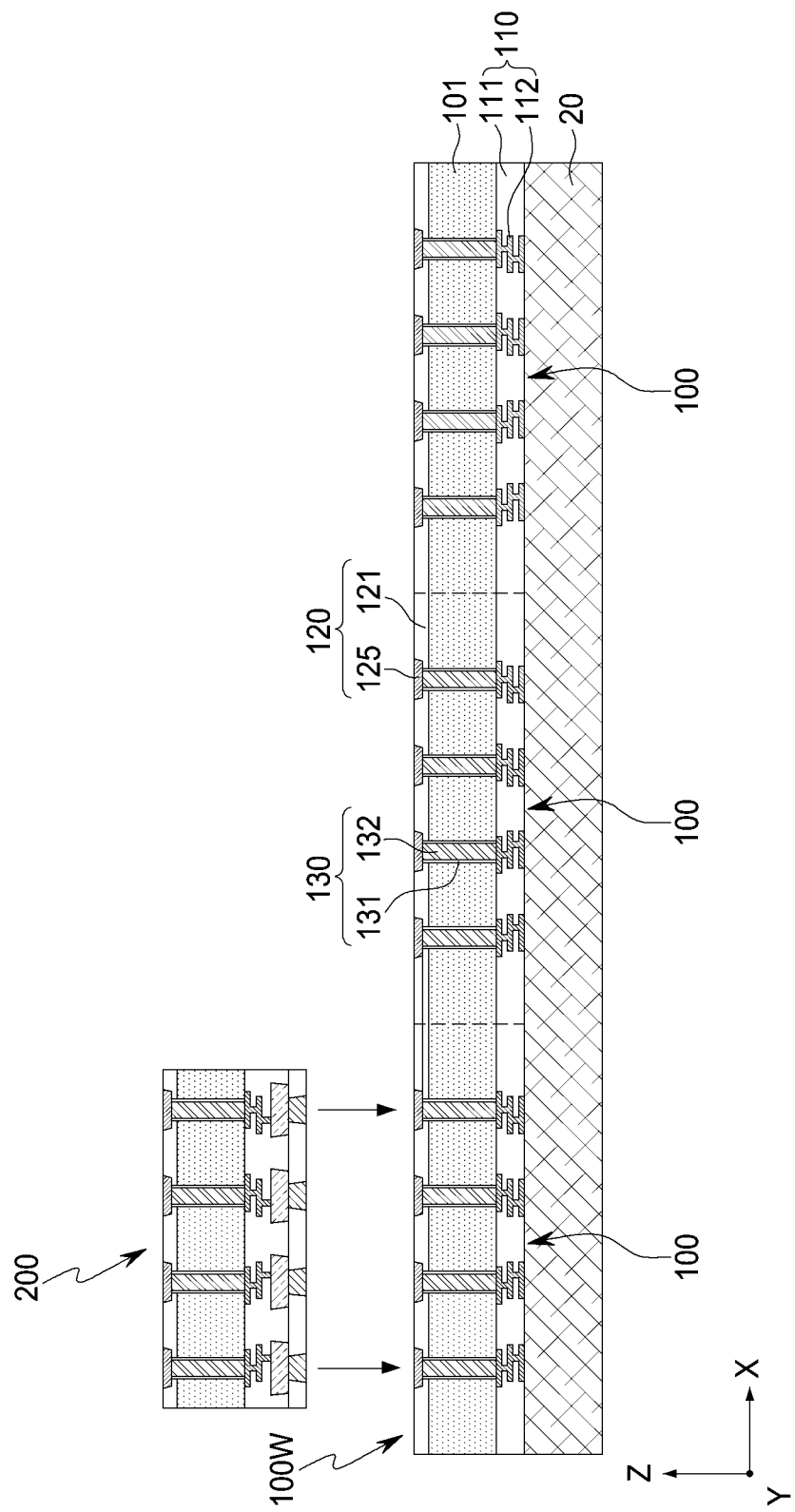
FIGS. 15 to 17 are cross-sectional views illustrating a process of bonding semiconductor chips manufactured with reference to FIGS. 14A to 14H on a wafer.
Figure 16A:
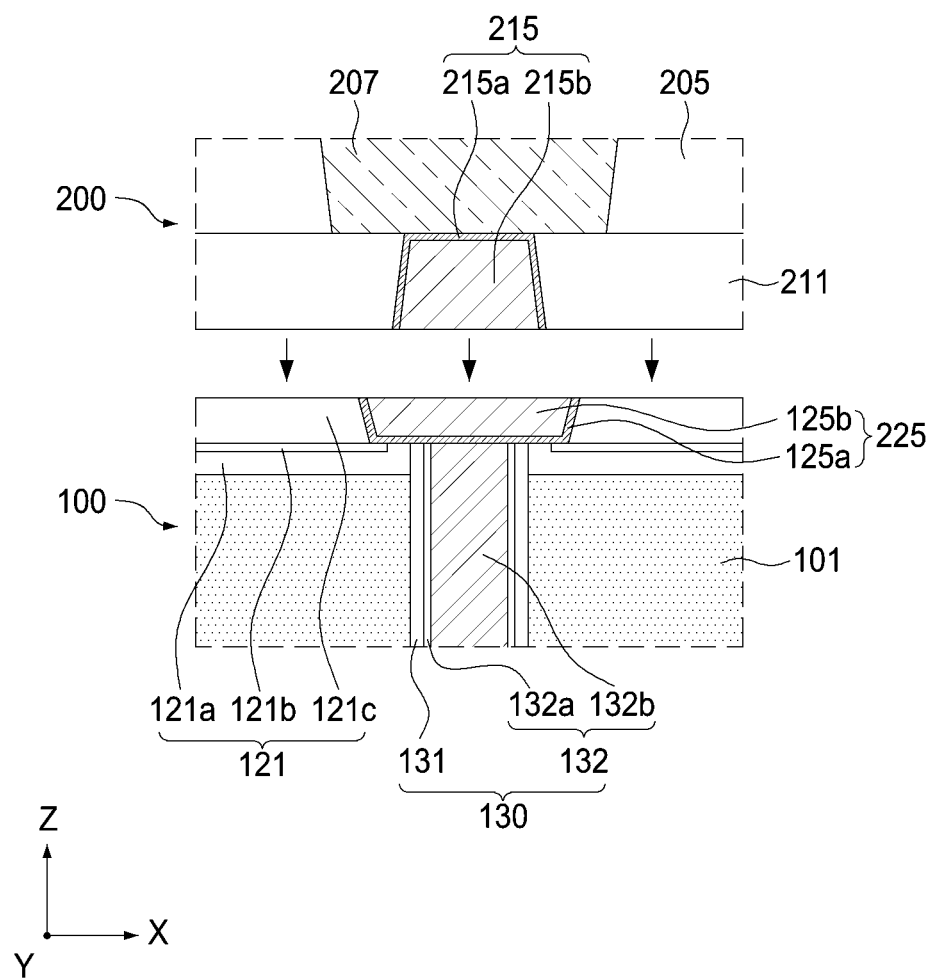
Figure 16B:
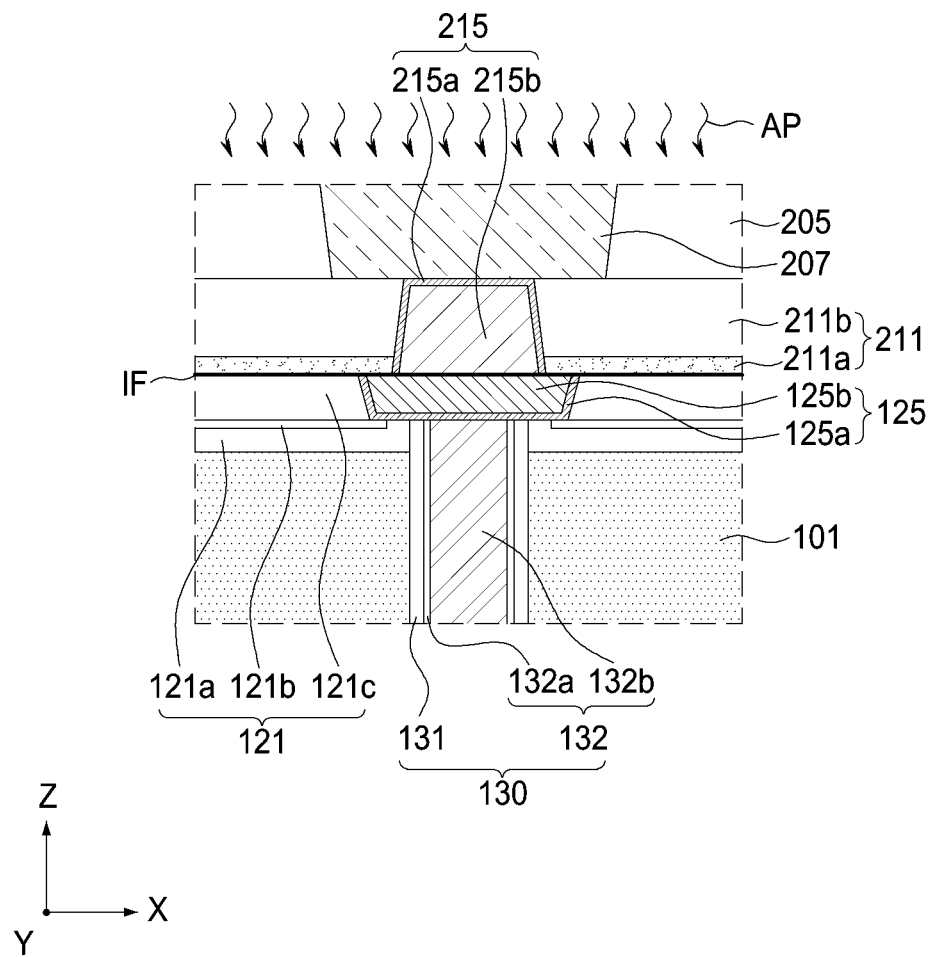
Figure 17:
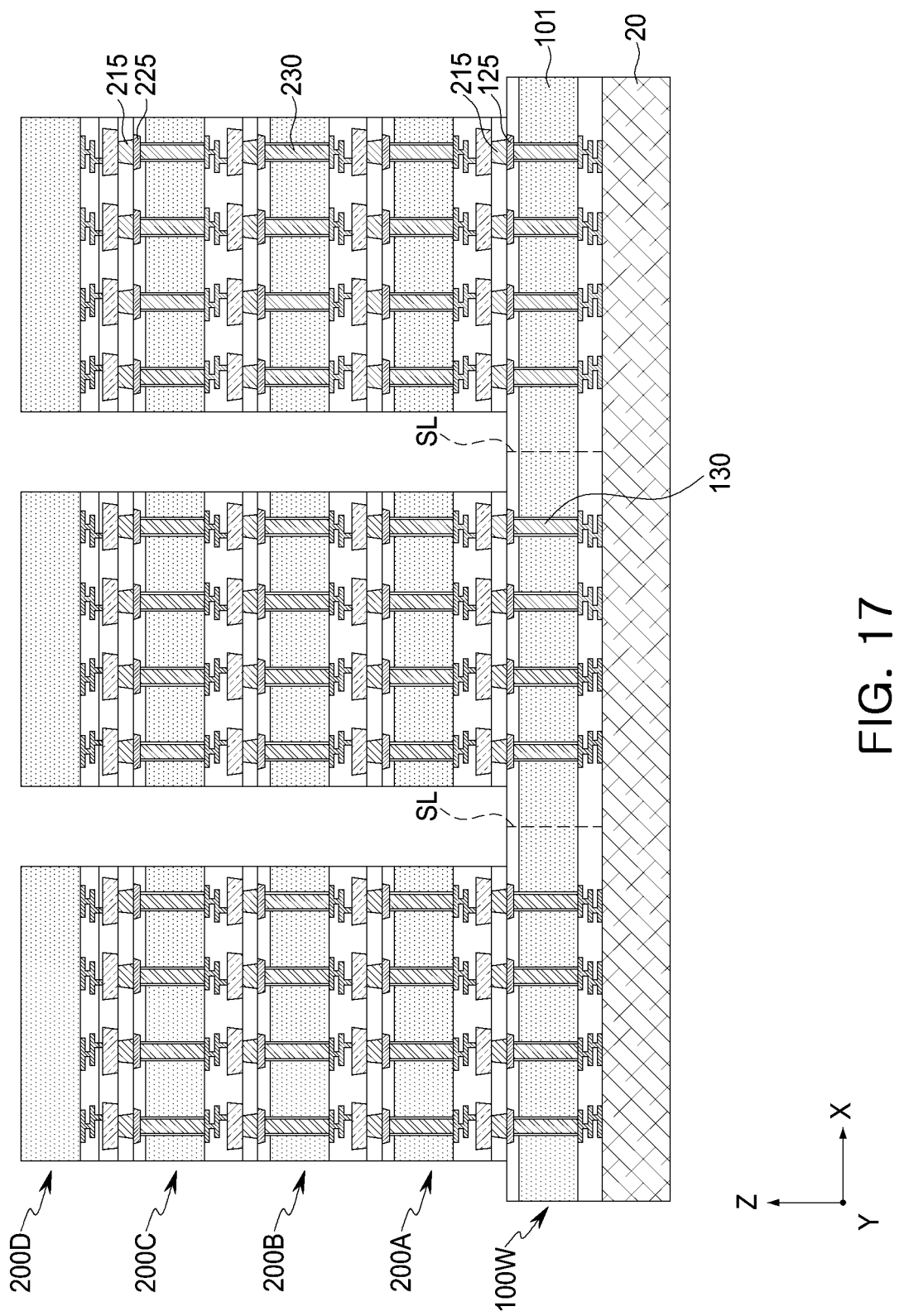

FIGS. 15 to 17 are cross-sectional views illustrating a process of bonding semiconductor chips manufactured with reference to FIGS. 14A to 14H on a wafer. FIGS. 15 to 17 illustrate a process of bonding the second semiconductor chips manufactured with reference to FIGS. 14A to 14H on a wafer on which the first semiconductor chip is formed.

Referring to FIG. 15, first, the first semiconductor wafer 100W for the first semiconductor chips 100 having the first through-structures 130 may be attached to a second carrier 20 using an adhesive material layer. The first semiconductor wafer 100W may be in a state in which components for the first semiconductor chips 100 are implemented.

Next, the second semiconductor chip 200 manufactured through the manufacturing process of FIGS. 14A to 14H may be attached to the first semiconductor wafer 100W. The second semiconductor chip 200 may be attached on the first semiconductor wafer 100W such that the second front structure 210 faces the first semiconductor wafer 100W.

Referring to FIGS. 16A and 16B, after the first rear structure 120 of the first semiconductor chip 100 and the second front structure 210 of the second semiconductor chip 200 are bonded to each other, an annealing process (AP) may be performed to obtain direct bonding or hybrid bonding.

Before bonding the first semiconductor chip 100 and the second semiconductor chip 200, an oxygen plasma treatment process may be performed to activate a surface of each of the first rear insulating layer 121 of the first rear structure 120 and the second front insulating layer 211 of the second front structure 210. The annealing process AP may be, for example, a low temperature annealing process of about 200° C. or less. When the second front insulating layer 211 is formed of silicon carbon nitride, a portion of the second front insulating layer 211 may be formed as a first insulating layer 211a bonded to the first rear insulating layer 121 and including silicon oxycarbonitride as an annealing process (AP) is performed. As described above, since the insulating material constituting the first rear insulating layer 121 and the insulating material constituting the second front insulating layer 211 are different from each other, the dielectric-to-dielectric bonding force between the different insulating layers may be improved.

Referring to FIG. 17, second semiconductor chips 200A, 200B, 200C, and 200D may be sequentially stacked. As for the second semiconductor chips 200A, 200B, 200C, and 200D, the other second semiconductor chips 200B, 200C, and 200D may be direct-bonded or hybrid-bonded on the lowermost second semiconductor chip 200A in a manner similar to that of the method described above with reference to FIGS. 15 to 16B.

Thereafter, an encapsulant 500 (e.g., FIG. 1) may be formed on the first semiconductor wafer 100W, a polishing process may be performed, and the encapsulant 500 and the first semiconductor wafer 100W may be cut along the scribe line SL to separate a plurality of semiconductor packages 1000.

By forming the lower insulating bonding layer and the upper insulating bonding layer for direct bonding of the lower semiconductor chip and the upper semiconductor chip using different materials, bonding strength may be improved, thereby providing a semiconductor package with improved reliability and a method for manufacturing the same.

While example embodiments have been shown and described above, it will be apparent to those skilled in the art that modifications and variations could be made without departing from the scope of the present inventive concept as defined by the appended claims.

What is claimed is:
1. A semiconductor package comprising:
a first semiconductor chip comprising a first semiconductor layer, a first through-electrode that penetrates through the first semiconductor layer in a vertical direction, a first bonding pad connected to the first through-electrode, and a first insulating bonding layer on a side surface of the first bonding pad; and a second semiconductor chip on the first semiconductor chip and comprising a second semiconductor layer, a second bonding pad below the second semiconductor layer and bonded to the first bonding pad, and a second insulating bonding layer on a side surface of the second bonding pad and bonded to the first insulating bonding layer, wherein the first insulating bonding layer comprises a first insulating material, the second insulating bonding layer comprises a first insulating layer that forms a bonding interface with the first insulating bonding layer and a second insulating layer on the first insulating layer, the first insulating layer comprises a second insulating material, different from the first insulating material, the second insulating layer comprises a third insulating material, different from the second insulating material, wherein the first bonding pad and the second bonding pad bonded to each other to form a portion of the bonding interface have an asymmetrical structure in which at least one of widths and thicknesses thereof are different.

2. The semiconductor package of claim 1, wherein the third insulating material is different from the first insulating material.

3. The semiconductor package of claim 1, wherein the first insulating bonding layer has a porous structure comprising a larger number of pores therein than the second insulating bonding layer.

4. The semiconductor package of claim 1, wherein the first insulating material is silicon oxide, the second insulating material is silicon oxycarbonitride, and the third insulating material is silicon carbonitride or silicon oxide.

5. The semiconductor package of claim 1, wherein the second insulating layer comprises a plurality of insulating layers.

6. The semiconductor package of claim 5, wherein some of the plurality of insulating layers of the second insulating layer comprise the third insulating material, and the other of the plurality of insulating layers of the second insulating layer comprises a fourth insulating material different from the third insulating material.

7. The semiconductor package of claim 1, wherein the first bonding pad has a first width and first thickness, and the second bonding pad has a second width that is less than the first width and a second thickness that is greater than the first thickness.

8. The semiconductor package of claim 1, wherein:

the second semiconductor chip further comprises a device layer between the second semiconductor layer and the second bonding pad, and the device layer comprises an interconnection layer, an interlayer insulating layer on a side surface of the interconnection layer, and an interconnection pad that electrically connects the interconnection layer to the second bonding pad.

9. The semiconductor package of claim 8, wherein the interlayer insulating layer comprises tetraethyl orthosilicate (TEOS).

10. The semiconductor package of claim 8, wherein the second bonding pad is received in a recess in a lower portion of the interconnection pad.

11. The semiconductor package of claim 1, wherein a central axis of the first bonding pad is horizontally offset from a central axis of the second bonding pad.

12. The semiconductor package of claim 1, wherein the second semiconductor chip comprises a plurality of second semiconductor chips stacked on the first semiconductor chip in the vertical direction, each of the plurality of second semiconductor chips comprises a rear insulating bonding layer and a front insulating bonding layer, and a material of the rear insulating bonding layer is different from a material of the front insulating bonding layer.

13. A semiconductor package comprising:

a first structure and a second structure on the first structure, wherein the first structure comprises:

a first semiconductor layer comprising a first front surface and an opposite first rear surface;

a first device layer on the first front surface of the first semiconductor layer and comprising a first interconnection layer;

a first through-electrode penetrating the first semiconductor layer and connected to the first interconnection layer of the first device layer; and a first bonding structure comprising a first bonding pad on the first rear surface of the first semiconductor layer and connected to the first through-electrode and a first insulating bonding layer on a side surface of the first bonding pad, and the second structure comprises:

a second semiconductor layer having a second front surface and an opposite second rear surface;

a second device layer on the second front surface of the second semiconductor layer and comprising a second interconnection layer; and a second bonding structure comprising a second bonding pad below the second device layer and bonded to and in direct contact with the first bonding pad and a second insulating bonding layer in direct contact with and bonded to the first insulating bonding layer, wherein the first bonding pad and the second bonding pad bonded to each other to form a portion of a bonding interface have an asymmetrical structure in which at least one of widths and thicknesses thereof are different, and the first insulating bonding layer and the second insulating bonding layer bonded to each other to form a portion of the bonding interface comprise different materials.

14. The semiconductor package of claim 13, wherein the first insulating bonding layer comprises a first insulating material, the second insulating bonding layer comprises a first insulating layer bonded to the first insulating bonding layer and a second insulating layer on the first insulating layer, and the first insulating layer comprises a second insulating material, different from the first insulating material.

15. The semiconductor package of claim 14, wherein the second insulating layer comprises a third insulating material, different from the second insulating material.

16. The semiconductor package of claim 15, wherein the first insulating material is silicon oxide, the second insulating material is silicon oxycarbonitride, and the third insulating material is silicon carbonitride.

17. A semiconductor package comprising:

a first structure and a second structure on the first structure, wherein the second structure comprises a plurality of semiconductor chips stacked on the first structure, and each of the plurality of semiconductor chips of the second structure comprises:

a semiconductor layer;

a through-electrode that penetrates through the semiconductor layer in a vertical direction;

a device layer connected to a first end of the through-electrode;

a rear bonding structure connected to a second, opposite end of the through-electrode, the rear bonding structure including a rear bonding pad; and a front bonding structure below the device layer, the front bonding structure including a front bonding pad, wherein, among the plurality of semiconductor chips of the second structure, the rear bonding structure of a lower semiconductor chip is directly bonded to and stacked on the front bonding structure of an upper semiconductor chip, an outermost insulating layer of the front bonding structure and an outermost insulating layer of the rear bonding structure comprise different materials, and wherein the rear bonding pad and the front bonding pad bonded to each other to form a portion of a bonding interface have an asymmetrical structure in which at least one of widths and thicknesses thereof are different.

18. The semiconductor package of claim 17, wherein the outermost insulating layer of the front bonding structure comprises a first insulating layer comprising silicon oxycarbonitride and a second insulating layer comprising silicon carbonitride.

19. The semiconductor package of claim 18, wherein the outermost insulating layer of the rear bonding structure comprises silicon oxide, and the silicon oxide of the outermost insulating layer of the rear bonding structure is in direct contact with the silicon oxycarbonitride of the outermost insulating layer of the front bonding structure.

20. The semiconductor package of claim 17, wherein the device layer comprises:

a transistor including a gate electrode, a gate dielectric layer between the gate electrode and the semiconductor layer, and an impurity region on the semiconductor layer on both sides of the gate electrode; and an interconnection layer electrically connecting the transistor to the through-electrode.

* * * * *